(12) United States Patent
Suzuki et al.

(10) Patent No.: US 10,832,890 B2
(45) Date of Patent: Nov. 10, 2020

(54) CHARGED PARTICLE BEAM DEVICE

(71) Applicant: HITACHI HIGH-TECH SCIENCE CORPORATION, Tokyo (JP)

(72) Inventors: Masato Suzuki, Tokyo (JP); Satoshi Tomimatsu, Tokyo (JP); Makoto Sato, Tokyo (JP); Tatsuya Asahata, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 16/364,898

(22) Filed: Mar. 26, 2019

(65) Prior Publication Data

US 2019/0304745 A1 Oct. 3, 2019

(30) Foreign Application Priority Data

Mar. 30, 2018 (JP) ................... 2018-069105

(51) Int. Cl.
*H01J 37/305* (2006.01)
*H01J 37/20* (2006.01)

(52) U.S. Cl.
CPC .......... *H01J 37/3053* (2013.01); *H01J 37/20* (2013.01); *H01J 2237/20214* (2013.01); *H01J 2237/20285* (2013.01)

(58) Field of Classification Search
CPC ...... H01J 37/20; H01J 37/305; H01J 37/3053; H01J 37/3056; H01J 2237/20214; H01J 2237/20285
See application file for complete search history.

(56) References Cited

U.S. PATENT DOCUMENTS

| | | | | |
|---|---|---|---|---|
| 2011/0309245 A1* | 12/2011 | Madokoro | ............. | G01N 1/286 250/307 |
| 2015/0060695 A1* | 3/2015 | Man | ..................... | H01J 37/252 250/442.11 |
| 2016/0064187 A1* | 3/2016 | Tomimatsu | ............. | H01J 37/20 250/453.11 |
| 2016/0141147 A1* | 5/2016 | Brogden | ................ | H01J 37/31 250/492.3 |

FOREIGN PATENT DOCUMENTS

JP 2009110745 A 5/2009
JP 2016050853 A 4/2016

* cited by examiner

*Primary Examiner* — David E Smith
(74) *Attorney, Agent, or Firm* — Holland & Hart LLP

(57) ABSTRACT

To automatically repeat an operation of isolating a sample piece, which is formed by processing a sample with an ion beam, and transferring the sample piece to a sample piece holder, a charged particle beam device includes a computer configured to perform control so that, without rotating a needle with which the sample piece is fixed to the sample piece holder, a deposition film deposited on the needle is irradiated with a charged particle beam from a charged particle beam irradiation optical system.

6 Claims, 13 Drawing Sheets

CHARGED PARTICLE BEAM DEVICE

CROSS REFERENCE TO RELATED APPLICATION

The present application claims priority to Japanese Patent Application No. JP 2018-069105, filed Mar. 30, 2018, the entire contents of which are incorporated herein for all purposes by this reference.

BACKGROUND OF THE INVENTION

1. Field of the Invention

The present invention relates to a charged particle beam device configured to automatically perform sampling.

2. Description of the Related Art

In preparing a sample piece for observation with a transmission electron microscope, a technology of processing with a focused ion beam is used. There is known an automatic sample piece manufacturing apparatus capable of automatically performing sampling in which a sample piece, which is manufactured by irradiating a sample with the focused ion beam, is isolated and transferred to a sample holder (see Japanese Patent Application Laid-open No. 2016-050853).

There is also known a charged particle beam device configured to shift a posture of a sample piece by rotating a needle holding the sample piece, and fix the sample piece to a sample holder, to thereby suppress the shower-curtain effect that occurs at the time of finish processing (see Japanese Patent Application Laid-open No. 2009-110745).

In this specification, the term "sampling" refers to isolating a sample piece, which is prepared by irradiating a sample with a charged particle beam, and processing the sample piece into a shape suitable for various processing, such as observation, analysis, and measurement, and more specifically, to transferring the sample piece, which is formed from the sample by processing with the focused ion beam, to a sample piece holder.

In the manufacturing of a plurality of sample pieces by the related-art automatic sample piece manufacturing apparatus, when a large amount of deposition film used for connection of a sample piece remains on the needle, connection strength between a sample piece and the needle may not be maintained in the next sampling. Therefore, needle cleaning, in which the deposition film deposited on the needle is irradiated with the focused ion beam from a plurality of directions for removal processing, has been performed at a frequency of about once every ten sequences of automatic sampling, for example.

However, in the automatic sampling in which the posture of the sample piece is shifted, it is required to perform needle trimming more frequently in order to maintain the connection strength such that the sample piece is not blown away from the needle by the rotation of the needle, and there has been a problem in that time required for the entire automatic sampling has been increased.

SUMMARY OF THE INVENTION

It is an object of the present invention to provide a charged particle beam device capable of performing automatic sampling in a shorter time than in a case of using needle cleaning in the related art.

In order to solve the above-mentioned problem and achieve the above-mentioned object, the present invention adopts the following aspects.

(1) There is provided a charged particle beam device, which is configured to automatically perform steps of isolating a sample piece from a sample, shifting a posture of the sample piece, and fixing the sample piece to a sample piece holder, the charged particle beam device including: a charged particle beam irradiation optical system configured to apply a charged particle beam; a sample stage, on which the sample is to be placed, and which is configured to move; a needle including a movement mechanism, the movement mechanism including a rotation axis and being configured to hold and carry the sample piece; a holder fixing table configured to hold the sample piece holder, to which the sample piece is to be transferred; a gas supply portion configured to supply a gas, from which a deposition film is to be formed through application of a focused ion beam; and a computer configured to perform control so that, without rotating the needle with which the sample piece is fixed to the sample piece holder, the deposition film deposited on the needle is irradiated with the charged particle beam from the charged particle beam irradiation optical system.

(2) In the charged particle beam device according to the above-mentioned item (1), the computer is configured to irradiate the deposition film and the needle with the charged particle beam from the charged particle beam irradiation optical system.

(3) In the charged particle beam device according to the above-mentioned item (2), the computer is configured to perform processing of removing an end surface of the needle by irradiating the end surface with the charged particle beam from the charged particle beam irradiation optical system, the end surface being formed when the sample piece and the needle are separated from each other.

(4) In the charged particle beam device according to the above-mentioned item (2) or (3), the computer is configured to irradiate a side of the needle on which the deposition film is deposited, with the charged particle beam from the charged particle beam irradiation optical system.

(5) In the charged particle beam device according to any one of the above-mentioned items (2) to (4), the computer is configured to irradiate, when a thickness dimension of a tip end of the needle exceeds a predetermined value, a side of the needle on which the deposition film is deposited, with the charged particle beam from the charged particle beam irradiation optical system, to perform processing so that the thickness dimension falls below the predetermined value.

(6) In the charged particle beam device according to any one of the above-mentioned items (1) to (5), the computer is configured to end application of the charged particle beam from the charged particle beam irradiation optical system depending on a change in brightness of each pixel in image data of the deposition film and the needle, the image data being acquired by irradiating the deposition film and the needle with the charged particle beam.

(7) In the charged particle beam device according to any one of the above-mentioned items (1) to (6), the computer is configured to irradiate, when the needle and the sample piece are separated from each other, the deposition film deposited on the needle, with the charged particle beam from the charged particle beam irradiation optical system.

With the deposition film deposited on the needle being irradiated with the charged particle beam without the needle with which the sample piece is fixed to the sample piece holder being rotated, a plurality of sequences of automatic sampling of a sample piece can be performed in a shorter time than in the case of using needle cleaning, in which the focused ion beam is applied from a plurality of directions for removal processing.

BRIEF DESCRIPTION OF THE DRAWINGS

FIG. 6A and FIG. 6B are schematic diagrams for illustrating a real tip end of a needle that has been repeatedly used in the charged particle beam device according to the embodiment of the present invention, in which FIG. 6A is a schematic diagram for illustrating an actual needle tip end, and FIG. 6B is a schematic diagram for illustrating a first image obtained based on an absorption current signal, in particular.

FIG. 7A and FIG. 7B are schematic diagrams of secondary electron images obtained by irradiating, with an electron beam, the needle tip end of the charged particle beam device according to the embodiment of the present invention, in which FIG. 7A is a schematic diagram for illustrating a second image obtained by extracting an area that is brighter than the background, and FIG. 7B is a schematic diagram for illustrating a third image obtained by extracting an area that is darker than the background, in particular.

DESCRIPTION OF THE EMBODIMENTS

Now, a charged particle beam device according to an embodiment of the present invention, which is capable of automatically preparing a sample piece, is described with reference to the accompanying drawings.

[Embodiments]

Figure 1:
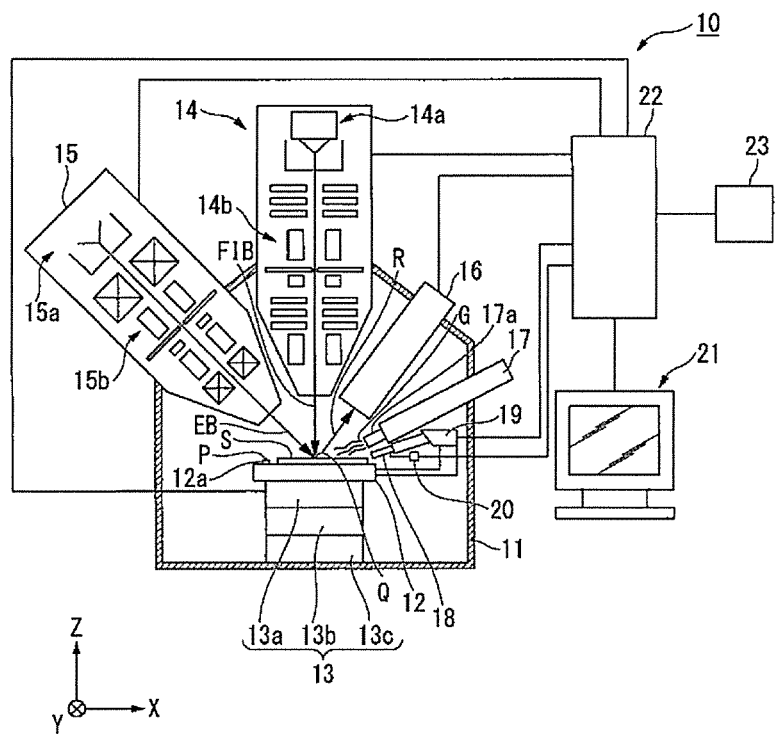
FIG. 1 is a configuration diagram of a charged particle beam device according to an embodiment of the present invention.

FIG. 1 is a configuration diagram of a charged particle beam device 10 according to the embodiment of the present invention. As illustrated in FIG. 1, the charged particle beam device 10 according to the embodiment of the present invention includes a sample chamber 11 capable of maintaining an inside thereof under a vacuum state, a stage 12 capable of fixing a sample S and a sample piece holder P inside the sample chamber 11, and a stage driving mechanism 13 configured to drive the stage 12. The charged particle beam device 10 includes a focused ion beam irradiation optical system 14 configured to irradiate an irradiation target within a predetermined irradiation area (that is, scan range) inside the sample chamber 11 with a focused ion beam (FIB). The charged particle beam device 10 includes an electron beam irradiation optical system 15 configured to irradiate the irradiation target within the predetermined irradiation area inside the sample chamber 11 with an electron beam (EB). The charged particle beam device 10 includes a detector 16 configured to detect secondary charged particles (secondary electrons and secondary ions) R generated from the irradiation target by the irradiation with the focused ion beam or the electron beam. The charged particle beam device 10 includes a gas supply portion 17 configured to supply a gas G to a surface of the irradiation target. The gas supply portion 17 is specifically a nozzle 17a having an outer diameter of about 200 µm, for example. The charged particle beam device 10 includes a needle 18 configured to take out a minute sample piece Q from the sample S fixed on the stage 12, hold the sample piece Q, and transfer the sample piece Q to the sample piece holder P, a needle driving mechanism 19 configured to drive the needle 18 to carry the sample piece Q, and an absorption current detector 20 configured to detect an inflow current (also referred to as "absorption current") of a charged particle beam flowing into the needle 18, and transmit an inflow current signal to a computer to image the inflow current signal.

The needle 18 and the needle driving mechanism 19 may be collectively referred to as a "sample piece transfer unit". The charged particle beam device 10 includes a display device 21 configured to image, for example, image data based on the secondary charged particles R detected by the detector 16, a computer 22, and an input device 23.

The irradiation target of the focused ion beam irradiation optical system 14 and the electron beam irradiation optical system 15 is the sample S fixed on the stage 12, the sample piece Q, and the needle 18 and the sample piece holder P that exist in an irradiation area, for example.

The charged particle beam device 10 according to the embodiment is capable of executing various kinds of processing (such as drilling and trimming processing) through imaging and sputtering of a portion to be irradiated, and formation of a deposition film, for example, by irradiating the surface of the irradiation target with the focused ion beam while scanning the focused ion beam. The charged particle beam device 10 is capable of executing processing for forming the sample piece Q (for example, thin sample or needle-like sample) for transmission observation with a transmission electron microscope or an analysis sample piece using the electron beam from the sample S. The charged particle beam device 10 is capable of executing processing for forming the sample piece Q that has been transferred to the sample piece holder P into a thin film having a desired thickness (for example, from 5 nm to 100 nm) suitable for the transmission observation with the transmission electron microscope. The charged particle beam device 10 is capable of executing observation of the surface of the irradiation target, for example, the sample piece Q and the needle 18, by irradiating the surface of the irradiation target with the focused ion beam or the electron beam while scanning the focused ion beam or the electron beam.

The absorption current detector 20 includes a preamplifier to amplify the inflow current of the needle and transmits the amplified inflow current to the computer 22. Based on the inflow current of the needle detected by the absorption current detector 20 and a signal that is synchronous with scanning of the charged particle beam, an absorption current image of a needle shape can be displayed on the display device 21 such that the needle shape and a tip end position may be identified.

Figure 2:
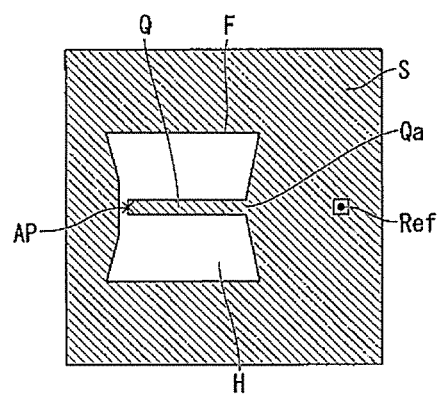
FIG. 2 is a plan view for illustrating a sample piece formed in a sample in the charged particle beam device according to the embodiment of the present invention.

FIG. 2 is a plan view for illustrating the sample piece Q, which is formed by irradiating the surface (hatched portion) of the sample S with the focused ion beam, before being isolated from the sample S in the charged particle beam device 10 according to the embodiment of the present invention. The reference symbol F indicates a processing frame with the focused ion beam, that is, the scan range of the focused ion beam, and the inside (white portion) thereof indicates a processing area H that has been subjected to sputtering processing and drilled by being irradiated with the focused ion beam. The reference symbol Ref is a reference mark (reference point) indicating a position at which the sample piece Q is formed (left without being drilled). The reference mark Ref has a shape in which, for example, a fine hole having a diameter of 30 nm, for example, is formed in a deposition film (for example, square with one side being 1 µm), which is to be described later, with the focused ion beam, and can be recognized at good contrast in the image with the focused ion beam or the electron beam. The deposition film is used to find a rough position of the sample piece Q, and the fine hole is used for fine registration. In the sample S, the sample piece Q is subjected to etching processing such that surrounding portions on a side portion side and a bottom portion side are cut down and removed to leave a support portion Qa connected to the sample S, and is cantilevered by the sample S via the support portion Qa. The sample piece Q is a minute sample piece with a longitudinal dimension of about 10 µm, 15 µm, or 20 µm, for example, and a width (thickness) of about 500 nm, 1 µm, 2 µm, or 3 µm, for example.

The sample chamber 11 is capable of exhausting air from the inside by an exhaust device (not shown) until a desired vacuum state is achieved, and is configured to be able to maintain the desired vacuum state.

The stage 12 is configured to hold the sample S. The stage 12 includes a holder fixing table 12a configured to hold the sample piece holder P. The holder fixing table 12a may have the structure capable of mounting a plurality of sample piece holders P.

Figure 3:
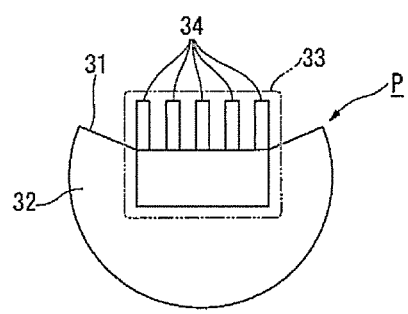
FIG. 3 is a plan view for illustrating a sample piece holder of the charged particle beam device according to the embodiment of the present invention.
Figure 4:
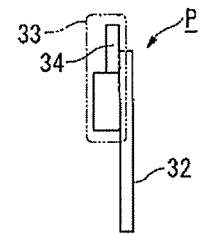
FIG. 4 is a side view for illustrating the sample piece holder of the charged particle beam device according to the embodiment of the present invention.

FIG. 3 is a plan view of the sample piece holder P, and FIG. 4 is a side view of the sample piece holder P. The sample piece holder P includes a substantially semicircular plate-shaped base portion 32 having a notch portion 31, and a sample table 33 fixed to the notch portion 31. The base portion 32 is formed of metal with a circular plate shape having a diameter of 3 mm and a thickness of 50 µm, for example. The sample table 33 is formed from a silicon wafer by a semiconductor manufacturing process, for example, and is adhered to the notch portion 31 with a conductive adhesive. The sample table 33 has a comb-tooth shape, and includes a plurality of (for example, five, ten, fifteen, or twenty) pillar portions (hereinafter also referred to as "pillars") 34, which are arranged to be spaced apart from one another and protrude, and to which sample pieces Q are transferred.

With the pillar portions 34 having different widths, and through storing, in the computer 22, an image of the sample piece Q transferred to each pillar portion 34 and the pillar portion 34 in association with the pillar portion 34, and further with a corresponding sample piece holder P, a large number of sample pieces Q can be recognized without mistake even when the sample pieces Q are prepared from one sample S, and the subsequent analysis with the transmission electron microscope, for example, can be performed without mistaking association between the sample piece Q of interest and an isolation point on the sample S. Each pillar portion 34 is formed to have a tip end portion with a thickness of 10 µm or less, or 5 µm or less, for example, and is configured to hold the sample piece Q attached to the tip end portion.

The base portion 32 is not limited to the above-mentioned circular plate shape having the diameter of 3 mm and the thickness of 50 µm, for example, and may have a rectangular plate shape having a length of 5 mm, a height of 2 mm, and a thickness of 50 µm, for example. In short, the base portion 32 may have any shape with which the base portion 32 can be mounted on the stage 12 to be introduced into the subsequent transmission electron microscope, and with which all the sample pieces Q mounted on the sample table 33 are located within a movable range of the stage 12. With the base portion 32 having such shape, all the sample pieces Q mounted on the sample table 33 can be observed with the transmission electron microscope.

The stage driving mechanism 13 is contained inside the sample chamber 11 under a state of being connected to the stage 12, and is configured to shift the stage 12 with respect to a predetermined axis in accordance with a control signal output from the computer 22. The stage driving mechanism 13 includes a movement mechanism 13a configured to move the stage 12 at least along and in parallel to an X axis and a Y axis, which are parallel to a horizontal plane and orthogonal to each other, and a Z axis in a vertical direction, which is orthogonal to the X axis and the Y axis. The stage driving mechanism 13 includes a tilt mechanism 13b configured to tilt the stage 12 about the X axis or the Y axis, and a rotation mechanism 13c configured to rotate the stage 12 about the Z axis.

The focused ion beam irradiation optical system 14 is fixed to the sample chamber 11 so that a beam emission portion (not shown) faces the stage 12 at a position above the stage 12 in the vertical direction within the irradiation area inside the sample chamber 11, and with an optical axis being in parallel to the vertical direction. With this configuration, the irradiation target, for example, the sample S placed on the stage 12, the sample piece Q, and the needle 18 that exists within the irradiation area can be irradiated with the focused ion beam from above to below in the vertical direction. Alternatively, the charged particle beam device 10 may include another ion beam irradiation optical system instead of such focused ion beam irradiation optical system 14 as described above. The ion beam irradiation optical system is not limited to such an optical system configured to form the focused beam as described above. The ion beam irradiation optical system may be a projection ion beam irradiation optical system, in which a stencil mask having a regular aperture is mounted in the optical system to form a shaped beam having a shape of the aperture of the stencil mask, for example. With the projection ion beam irradiation optical system, a shaped beam having a shape corresponding to the processing area in the vicinity of the sample piece Q can be formed accurately, and processing time is reduced.

The focused ion beam irradiation optical system 14 includes an ion source 14a configured to generate ions, and an ion optical system 14b configured to focus and deflect the ions extracted from the ion source 14a. The ion source 14a and the ion optical system 14b are controlled in accordance with a control signal output from the computer 22 such that an irradiation position, irradiation conditions, and the like of the focused ion beam are controlled by the computer 22. The ion source 14a is a liquid metal ion source using liquid gallium, for example, a plasma ion source, or a gas field ionization ion source, for example. The ion optical system 14b includes a first electrostatic lens, for example, a condenser lens, an electrostatic deflector, and a second electrostatic lens, for example, an objective lens, for example. Use of a plasma ion source as the ion source 14a enables achievement of fast processing with a large-current beam, and hence is suitable for isolation of a large sample S.

The electron beam irradiation optical system 15 is fixed to the sample chamber 11 so that a beam emission portion (not shown) faces the stage 12 in a tilt direction with a tilt of a predetermined angle (for example, 60°) with respect to the vertical direction of the stage 12 within the irradiation area inside the sample chamber 11, and so that an optical axis is parallel to the tilt direction. With this configuration, the sample S fixed to the stage 12, the irradiation target, for example, the sample piece Q, and the needle 18 that exists within the irradiation area can be irradiated with the electron beam from above to below in the tilt direction.

The electron beam irradiation optical system 15 includes an electron source 15a configured to generate electrons, and an electron optical system 15b configured to focus and deflect the electrons emitted from the electron source 15a. The electron source 15a and the electron optical system 15b are controlled in accordance with a control signal output from the computer 22 such that an irradiation position, irradiation conditions, and the like of the electron beam are controlled by the computer 22. The electron optical system 15b includes an electromagnetic lens and a deflector, for example.

The arrangement of the electron beam irradiation optical system 15 and the focused ion beam irradiation optical system 14 may be switched so as to arrange the electron beam irradiation optical system 15 in the vertical direction, and arrange the focused ion beam irradiation optical system 14 in the tilt direction with the tilt of the predetermined angle in the vertical direction.

The detector 16 is configured to detect an intensity R of the secondary charged particles (secondary electrons and secondary ions) (that is, an amount of the secondary charged particles) radiated from the irradiation target when the irradiation target, for example, the sample S and the needle 18 are irradiated with the focused ion beam or the electron beam, and to output information on the detected amount of the secondary charged particles R. The detector 16 is arranged at a position at which the amount of the secondary charged particles R can be detected inside the sample chamber 11, for example, a position that is obliquely upward with respect to the irradiation target, for example, the sample S within the irradiation area, and is connected to the sample chamber 11.

The gas supply portion 17 is fixed to the sample chamber 11, includes a gas injection portion (also referred to as a "nozzle") inside the sample chamber 11, and is arranged to face the stage 12. The gas supply portion 17 is capable of supplying, to the sample S, an etching gas for selectively facilitating etching of the sample S with the focused ion beam depending on a material of the sample S, a deposition gas for forming the deposition film of a deposit of metal or an insulator on the surface of the sample S, and the like. For example, through supplying, to the sample S, a xenon fluoride for a silicon-based sample S, water for an organic sample S, and other etching gas along with irradiation with the focused ion beam, the etching is facilitated in a material-selective manner. Moreover, through supplying, to the sample S, the deposition gas containing platinum, carbon, or tungsten, for example, along with the irradiation with the focused ion beam, a solid component decomposed from the deposition gas can be deposited on the surface of the sample S. Specific examples of the deposition gas include phenanthrene, naphthalene, pyrene, or the like as a gas containing carbon, trimethyl(ethylcyclopentadienyl)platinum or the like as a gas containing platinum, and tungsten hexacarbonyl or the like as a gas containing tungsten. Moreover, depending on the supplied gas, etching and deposition can be performed also by being irradiated with the electron beam. It should be noted, however, that, from the viewpoints of a deposition speed and reliable deposition of the deposition film between the sample piece Q and the needle 18, the deposition gas containing carbon, for example, phenanthrene, naphthalene, pyrene, or the like is optimal as the deposition gas in the charged particle beam device 10 according to the present invention, and any one of those examples is used.

The needle driving mechanism 19 is contained inside the sample chamber 11 under a state of being connected to the needle 18, and is configured to shift the needle 18 in accordance with a control signal output from the computer 22. The needle driving mechanism 19 is provided integrally with the stage 12, and when the stage 12 is rotated about a tilt axis (that is, the X axis or the Y axis) by the tilt mechanism 13*b*, for example, the needle driving mechanism 19 is moved integrally with the stage 12. The needle driving mechanism 19 includes a movement mechanism (not shown) configured to move the needle 18 along and in parallel to each of three-dimensional coordinate axes, and a rotation mechanism (not shown) configured to rotate the needle 18 about a central axis of the needle 18. The three-dimensional coordinate axes are independent of the orthogonal three-axis coordinate system of a sample stage, and are included in an orthogonal three-axis coordinate system having two-dimensional coordinate axes that are parallel to the surface of the stage 12. When the surface of the stage 12 is in a tilt state and a rotation state, the coordinate system is tilted and rotated.

The computer 22 is configured to control at least the stage driving mechanism 13, the focused ion beam irradiation optical system 14, the electron beam irradiation optical system 15, the gas supply portion 17, and the needle driving mechanism 19.

The computer 22 is arranged outside the sample chamber 11, and is connected to the display device 21, and the input device 23, for example, a mouse or a keyboard, which is configured to output a signal corresponding to an input operation of an operator.

The computer 22 is configured to centrally control the operation of the charged particle beam device 10 with the signal output from the input device 23, or a signal generated by preset automatic driving control processing, for example.

The computer 22 is configured to convert the detected amount of the secondary charged particles R, which is detected by the detector 16, into a brightness signal associated with the irradiation position while scanning an irradiation position of the charged particle beam, and generate image data indicating a shape of the irradiation target by a two-dimensional position distribution of the detected amount of the secondary charged particles R. In an absorption current image mode, the computer 22 detects the absorption current flowing through the needle 18 while scanning the irradiation position of the charged particle beam, to thereby generate absorption current image data indicating the shape of the needle 18 by the two-dimensional position distribution (absorption current image) of the absorption current. The computer 22 is configured to display, on the display device 21, along with sets of the generated image data, a screen for executing enlargement, reduction, movement, rotation, and other operations of the sets of image data. The computer 22 is configured to display, on the display device 21, a screen for making various settings, such as mode selection and processing setting in automatic sequence control.

The charged particle beam device 10 according to the embodiment of the present invention has the above-mentioned configuration, and the operation of the charged particle beam device 10 is described next.

Now, automatic sampling operation to be executed by the computer 22, that is, the operation of automatically transferring the sample piece Q, which is formed by processing the sample S with the charged particle beam (focused ion beam), to the sample piece holder P is broadly divided into an initial setting step, a sample piece pickup step, and a sample piece mounting step, and those steps are described in turn.

<Initial Setting Step>

Figure 5:
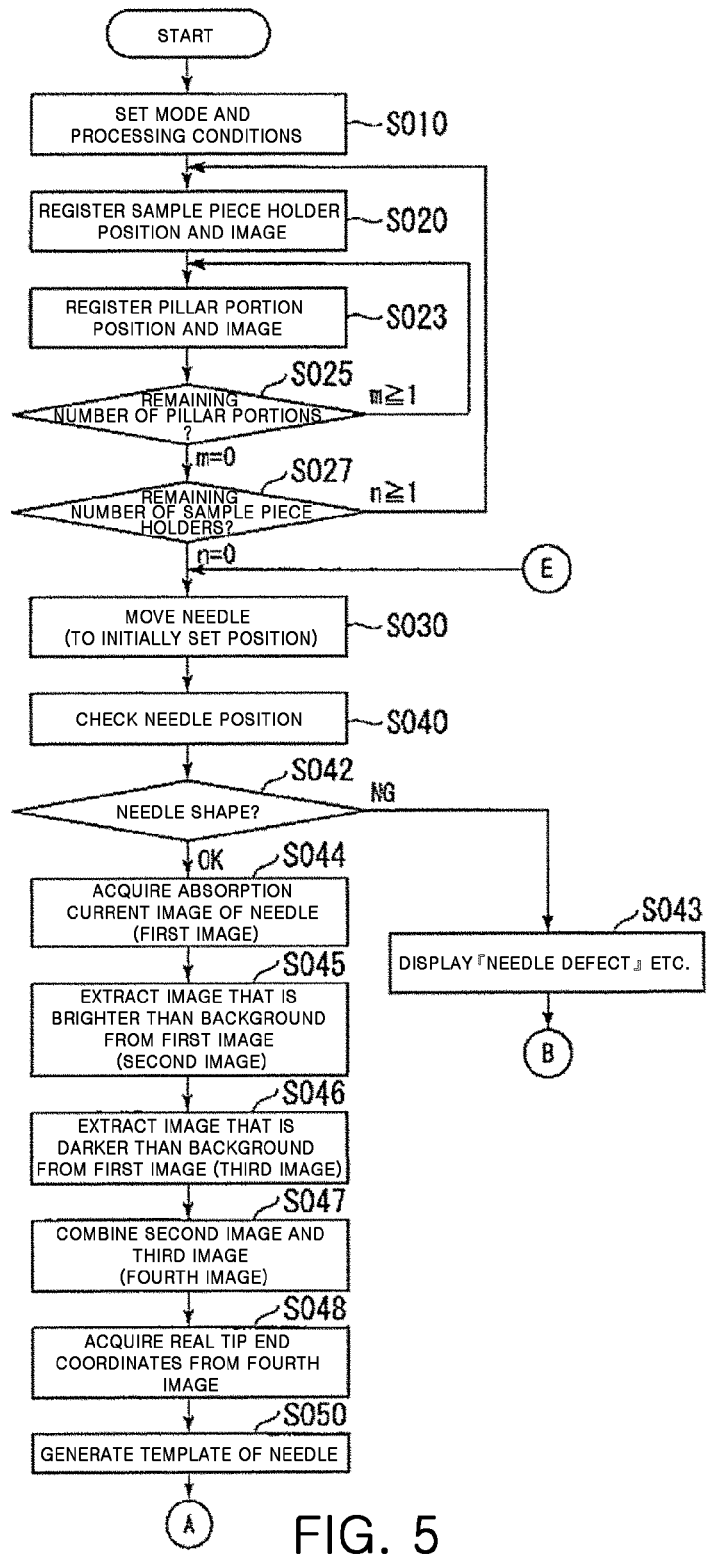
FIG. 5 is a flow chart of an initial setting step, in particular, of a flow chart for illustrating operation of the charged particle beam device according to the embodiment of the present invention.

FIG. 5 is a flow chart for illustrating a flow of the initial setting step of the automatic sampling of the operation of the charged particle beam device 10 according to the embodiment of the present invention. First, the computer 22 performs selection of a mode, for example, whether or not to perform a posture control mode, which is to be described later, setting of observation conditions for template matching and processing condition (setting of processing position, dimensions, number, and the like), a check on the needle tip shape, and the like in accordance with the input from the operator at the start of an automatic sequence (Step S010).

Next, the computer 22 generates a template of a pillar portion 34 (Step S020 to Step S027). In this template generation, the computer 22 first performs processing of registering the position of the sample piece holder P to be mounted on the holder fixing table 12*a* of the stage 12 by the operator (Step S020). The computer 22 generates the template of the pillar portion 34 first in the sampling process. The computer 22 generates the template for each pillar portion 34. The computer 22 performs acquisition of stage coordinates of each pillar portion 34 and the template generation, and stores the stage coordinates and the template as one set, which is used later in template matching (superimposition of the template and the image on each other) to determine a shape of the pillar portion 34. The computer 22 stores in advance, as the template of the pillar portion 34 used in the template matching, the image itself, or edge information extracted from the image, for example. In a later process, the computer 22 may perform the template matching after the movement of the stage 12 to determine the shape of the pillar portion 34 based on a score of the template matching, to thereby recognize a precise position of the pillar portion 34. When the same observation conditions, such as the same contrast and magnification, as those for generating the template are used as the observation conditions for template matching, accurate template matching can be advantageously performed.

When a plurality of sample piece holders P are mounted on the holder fixing table 12*a*, and a plurality of pillar portions 34 are provided in each of the sample piece holders P, a recognition code unique to each sample piece holder P, and a recognition code unique to each pillar portion 34 of the sample piece holder P may be set in advance, and those recognition codes may be associated with the coordinates and template information of each pillar portion 34 to be stored in the computer 22.

Moreover, the computer 22 may store, along with the recognition codes, and the coordinates and the template information of each pillar portion 34 described above, coordinates of a site (isolation portion) in the sample S from which the sample piece Q is isolated, and image information of a surrounding sample surface as a set.

Moreover, for example, in a case of a sample of an indefinite shape, for example, a rock, a mineral, and a biological sample, the computer 22 may group together a low-magnification wide-field image, position coordinates and an image of the isolation portion, and the like as a set, to store the set of information as recognition information.

The recognition information may be associated with a thinned sample S, or with a transmission electron microscope image and the isolation position of the sample S to be stored.

The computer 22 can check in advance, by performing processing of registering the position of the sample piece holder P before moving the sample piece Q, which is to be described later, that the sample table 33 having an appropriate shape actually exists.

In this position registration processing, the computer 22 first moves the stage 12 by the stage driving mechanism 13 as a coarse adjustment operation to register the irradiation area to a position at which the sample table 33 is attached in the sample piece holder P. Next, the computer 22 extracts, from the sets of image data generated by the irradiation with the charged particle beam (the focused ion beam and the electron beam), positions of the plurality of pillar portions 34 forming the sample table 33 with the use of a template generated in advance based on a design shape (CAD information) of the sample table 33 as a fine adjustment operation. Then, the computer 22 performs the processing of registering (storing) the extracted position coordinates of each pillar portion 34 and the images as an attachment position of the sample piece Q (Step S023). At this time, the images of each pillar portion 34 are compared with a design drawing or CAD drawing of the pillar portion, or an image of a standard good of the pillar portion 34 that has been prepared in advance, to thereby check whether there is deformation, chipping, lack, or the like of each pillar portion 34, and when there is a defect, the fact that the pillar portion is a defective good is also stored in the computer 22 along with the coordinate position and the images of the pillar portion.

Next, it is determined whether there is no more pillar portion 34 to be registered in the sample piece holder P on which the registration processing is currently executed (Step S025). When a result of the determination is "YES", that is, when a remaining number m of pillar portions 34 to be registered is 1 or more, the processing returns to Step S023 described above to repeat Step S023 and Step S025 until the remaining number m of pillar portions 34 becomes zero. In contrast, when the result of the determination is "NO", that is, when the remaining number m of pillar portions 34 to be registered is zero, the processing proceeds to Step S027.

When the plurality of sample piece holders P are mounted on the holder fixing table 12a, position coordinates of each sample piece holder P and image data of the sample piece holder P are recorded along with a code number for each sample piece holder P and the like, and further, the position coordinates of each pillar portion 34 of each sample piece holder P and the corresponding code number and image data are stored (subjected to registration processing). The computer 22 may perform the position registration processing in succession for the number of sample pieces Q for which the automatic sampling is to be performed.

Next, the computer 22 determines whether there is no more sample piece holders P to be registered (Step S027). When a result of the determination is "YES", that is, when a remaining number n of sample piece holders P to be registered is 1 or more, the processing returns to Step S020 described above to repeat Step S020 and Step S027 until the remaining number n of sample piece holders P becomes zero. In contrast, when the result of the determination is "NO", that is, when the remaining number n of sample piece holders P to be registered is zero, the processing proceeds to Step S030.

With this configuration, when ten sample pieces Q are automatically prepared from one sample S, positions of the plurality of sample piece holders P are registered in the holder fixing table 12a, and the positions of the pillar portions 34 of each of the sample piece holders P are registered as the images. Therefore, a particular sample piece holder P to which ten sample pieces Q are to be attached, and further a particular pillar portion 34 can be brought into a field of view of the charged particle beam immediately.

In this position registration processing (Step S020 and Step S023), if the sample piece holder P itself or a pillar portion 34 is deformed or damaged and is not in a state under which the sample piece Q can be attached, for example, "unusable" (notation that the sample piece Q cannot be attached) is also registered along with, and in association with, the position coordinates, the image data, and the code number described above. As a result, in transferring of the sample piece Q, which is to be described later, the computer 22 may skip the "unusable" sample piece holder P or pillar portion 34, and move the next normal sample piece holder P or pillar portion 34 into an observation field.

Next, the computer 22 generates a template of the needle 18 (Step S030 to Step S050). The template is used for image matching when the needle is brought closer to the sample piece accurately, which is to be described later.

In this template generation step, the computer 22 first moves the stage 12 by the stage driving mechanism 13 once. Subsequently, the computer 22 moves the needle 18 to an initially set position by the needle driving mechanism 19 (Step S030). The initially set position is a preset position which can be irradiated with the focused ion beam and the electron beam substantially at the same point, which is a point (coincidence point) on which both beams are focused, and at which, through stage movement that is performed immediately before, there is no complicated structure, which may be erroneously recognized as the needle 18, for example, the sample S in the background of the needle 18. This coincidence point is a position at which the same target can be observed from different angles by the irradiation with the focused ion beam and the irradiation with the electron beam.

Next, the computer 22 recognizes a position of the needle 18 in an absorption image mode by the irradiation with the electron beam (Step S040).

The computer 22 detects the absorption current flowing into the needle 18 by irradiating the needle 18 with the electron beam while scanning the electron beam, to thereby generate the absorption current image data. At this time, there is no background that may be erroneously recognized as the needle 18 in the absorption current image, and hence the needle 18 can be recognized without being affected by the background image. The computer 22 acquires the absorption current image data by the irradiation with the electron beam. The reason why the template is generated with the use of the absorption current image is as follows. When the needle approaches the sample piece, a shape that may be erroneously recognized as the needle, for example, a processed shape of the sample piece and a pattern of a sample surface, often exists in the background of the needle, and there is a high possibility of erroneously recognizing the shape in a secondary electron image. In order to prevent such erroneous recognition, the absorption current image, which is not affected by the background, is used. The secondary electron image is easily affected by the background image, and is not suited as a template image for its high possibility of erroneous recognition. In this manner, a carbon deposition film at the needle tip end cannot be recognized in the absorption current image, and hence it is impossible to find a real needle tip. However, in view of the pattern matching with the template, the absorption current image is suitable.

At this time, the computer 22 determines the shape of the needle 18 (Step S042).

If the tip shape of the needle 18 is deformed or damaged, for example, and is not in a state under which the sample piece Q can be attached thereto (Step S042; NG), the processing jumps from Step S043 to the "NO" side of Step S300 in FIG. 26, and ends the automatic sampling operation without executing all of Step S050 and subsequent steps. In other words, when the needle tip shape has a defect, further work cannot be conducted, and the processing enters work of exchanging the needle by the device operator. In the determination of the needle shape in Step S042, when a needle tip position is shifted from a predetermined position by 100 μm or more in an observation field with one side being 200 μm, for example, the needle is determined as a defective good. When it is determined in Step S042 that the needle shape is defective, "needle defect" or other such message is displayed on the display device 21 (Step S043) to alert the operator of the device. The needle 18 that has been defected as the defective good may be replaced with a new needle 18, or may have the needle tip end shaped by irradiation with the focused ion beam when the defect is minor.

In Step S042, when the needle 18 has the predetermined normal shape, the processing proceeds to the next Step S044.

Now, a state of the needle tip end is described.

Figure 6A:
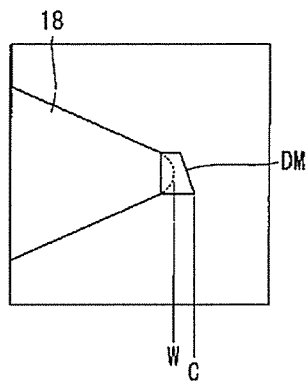

FIG. 6A is an enlarged schematic diagram of a needle tip end portion for illustrating a state under which a residue of a carbon deposition film DM is deposited on the tip end of the needle 18 (tungsten needle). The reason why the template is generated with the use of the absorption current image is as follows. When the needle 18 approaches the sample piece Q, a shape that may be erroneously recognized as the needle 18, for example, the processed shape of the sample piece Q and the pattern of the sample surface, often exists in the background of the needle 18, and hence there is a high possibility of erroneously recognizing the shape in the secondary electron image. In order to prevent such erroneous recognition, the absorption current image, which is not affected by the background, is used. The secondary electron image is easily affected by the background image, and is not suited as a template image for its high possibility of erroneous recognition. In this manner, the carbon deposition film DM at the needle tip end cannot be recognized in the absorption current image, and hence it is impossible to find the real needle tip. However, in view of the pattern matching with the template, the absorption current image is suitable.

Figure 6B:
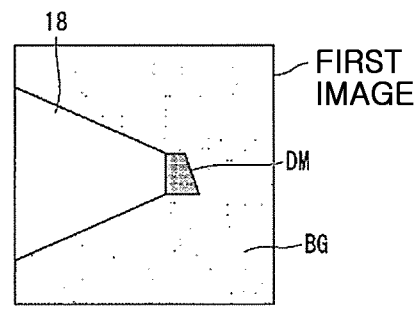

FIG. 6B is a schematic diagram of the absorption current image of the needle tip end portion on which the carbon deposition film DM is deposited. Even when there is a complicated pattern in the background, the needle 18 can be clearly recognized without being affected by the background shape. An electron beam signal with which the background is irradiated is not reflected in the image, and hence the background is shown in gray tone with a uniform noise level. In contrast, it has been found that the carbon deposition film DM appears slightly darker than the gray tone in the background, and that a tip end of the carbon deposition film DM cannot be clearly seen in the absorption current image. In the absorption current image, a real needle position including the carbon deposition film DM cannot be recognized. Therefore, when the needle 18 is moved based only on the absorption current image, there is a high possibility that the needle tip end collides against the sample piece Q.

Therefore, real tip end coordinates of the needle 18 are determined based on tip end coordinates C of the carbon deposition film DM as described below. In this specification, the image of FIG. 6B is referred to as a "first image".

A step of acquiring the absorption current image (first image) of the needle 18 is Step S044.

Next, the first image of FIG. 6B is subjected to image processing to extract a region that is brighter than the background (Step S045).

Figure 7A:
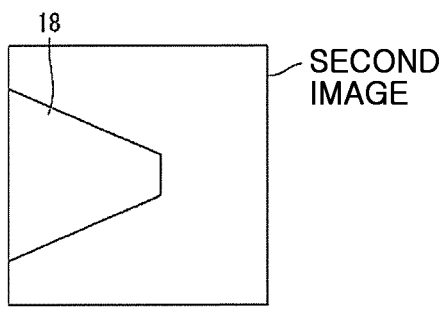

FIG. 7A is a schematic diagram of an image obtained by subjecting the first image of FIG. 6B to the image processing to extract the region that is brighter than the background. When a difference in brightness between the background and the needle 18 is small, image contrast may be increased, to thereby increase the difference in brightness between the background and the needle. In this manner, an image highlighting the region (a part of the needle 18) that is brighter than the background is obtained, and the image is referred to as a "second image" in this specification.

The second image is stored in the computer.

Next, in the first image of FIG. 6B, a region that is darker than the brightness of the background is extracted (Step S046).

Figure 7B:
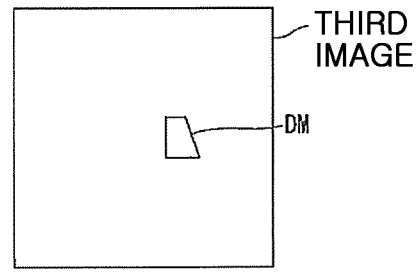

FIG. 7B is a schematic diagram of an image obtained by subjecting the first image of FIG. 6B to image processing to extract the region that is darker than the background. Only the carbon deposition film DM at the needle tip end is extracted and displayed. When a difference in brightness between the background and the carbon deposition film DM is small, image contrast may be increased, to thereby increase the difference in brightness between the background and the carbon deposition film DM in the image data. In this manner, an image manifesting the region that is darker than the background is obtained. The image is referred to as a "third image" in this specification, and the third image is stored in the computer 22.

Next, the second image and the third image, which have been stored in the computer 22, are combined with each other (Step S047).

Figure 8:
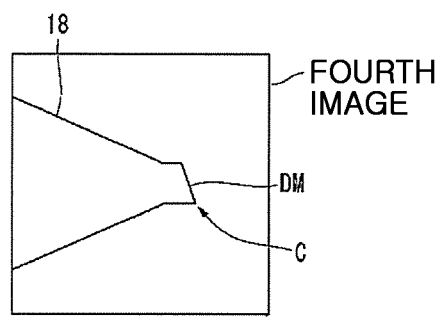
FIG. 8 is a schematic diagram for illustrating a fourth image obtained by combining the second image and the third image of FIG. 7A and FIG. 7B.

FIG. 8 is a schematic diagram of an image displayed after combining. It should be noted, however, that for visibility in the image, only the region of the needle 18 in the second image, and a contour of the portion of the carbon deposition film DM in the third image may be shown as lines, and the background and regions other than perimeters of the needle 18 and the carbon deposition film DM may be shown as transparent. Alternatively, only the background may be shown as transparent, and the needle 18 and the carbon deposition film DM may be shown in the same color or tone. In this manner, the second image and the third image are originally based on the first image, and hence, unless only one of the second image and the third image is deformed, for example, enlarged, reduced, or rotated, the image obtained by combining has a shape reflecting the first image. The image obtained by combining is referred to as a "fourth image" in this specification, and the fourth image is stored in the computer. The fourth image is subjected to processing of adjusting the contrast to highlight the contour on the basis of the first image, and hence the contour is clarified with the needle shape being exactly the same as in the first image and the fourth image, with the result that the tip end of the carbon deposition film DM becomes clearer than in the first image.

Next, the real tip end coordinates of the tip end of the carbon deposition film DM, that is, the needle 18 on which the carbon deposition film DM is deposited are determined based on the fourth image (Step S048).

The fourth image is retrieved from the computer 22 for display, and the real tip end coordinates of the needle 18 are determined. A point C, which protrudes the most in an axis direction of the needle 18, is the real needle tip, which is automatically determined by image recognition, and the tip end coordinates are stored in the computer 22.

Next, in order to further increase the accuracy of the template matching, the absorption current image of the needle tip end in the same observation field as in Step S044 is used as a reference image, and only a portion including the needle tip end, which is extracted from the reference image data using the needle tip end coordinates obtained in Step S048 as a reference, is used as the template image. The template image is registered in the computer 22 (Step S050) in association with reference coordinates (needle tip end coordinates) of the needle tip end, which are obtained in Step S048.

Next, the computer 22 performs the following processing as processing of bringing the needle 18 closer to the sample piece Q.

In Step S050, the reference image has been limited to the same observation field as in Step S044. However, the present invention is not limited thereto, and the reference image is not limited to the same field of view as long as the reference of beam scanning is managed. Moreover, in the above description of Step S050, the template has been described to include the needle tip end portion, but a region not including the tip end may be used as the template as long as the coordinates are associated with the reference coordinates.

With the use of the image data that is actually acquired prior to moving the needle 18 as the reference image data, the computer 22 can perform accurate template matching irrespective of differences in shape of individual needles 18. Further, the computer 22 acquires the sets of image data under the state in which there is no complicated structure in the background, and hence can determine precise and real needle tip end coordinates. Moreover, it is possible to acquire the template with which the shape of the needle 18 eliminating the effect of the background can be clearly grasped.

In acquiring the sets of image data, the computer 22 uses previously stored suitable image acquisition conditions, such as magnification, brightness, and contrast, to increase recognition accuracy of the target.

Moreover, the above-mentioned steps (Step S020 to Step S027) of generating the template of the pillar portion 34, and the steps (Step S030 to Step S050) of generating the template of the needle 18 may be interchanged. It should be noted, however, that when the steps (Step S030 to Step S050) of generating the template of the needle 18 precede, the flow (E) of returning from Step S300, which is to be described later, also precedes accordingly.

<Sample Piece Pickup Step>

Figure 9:
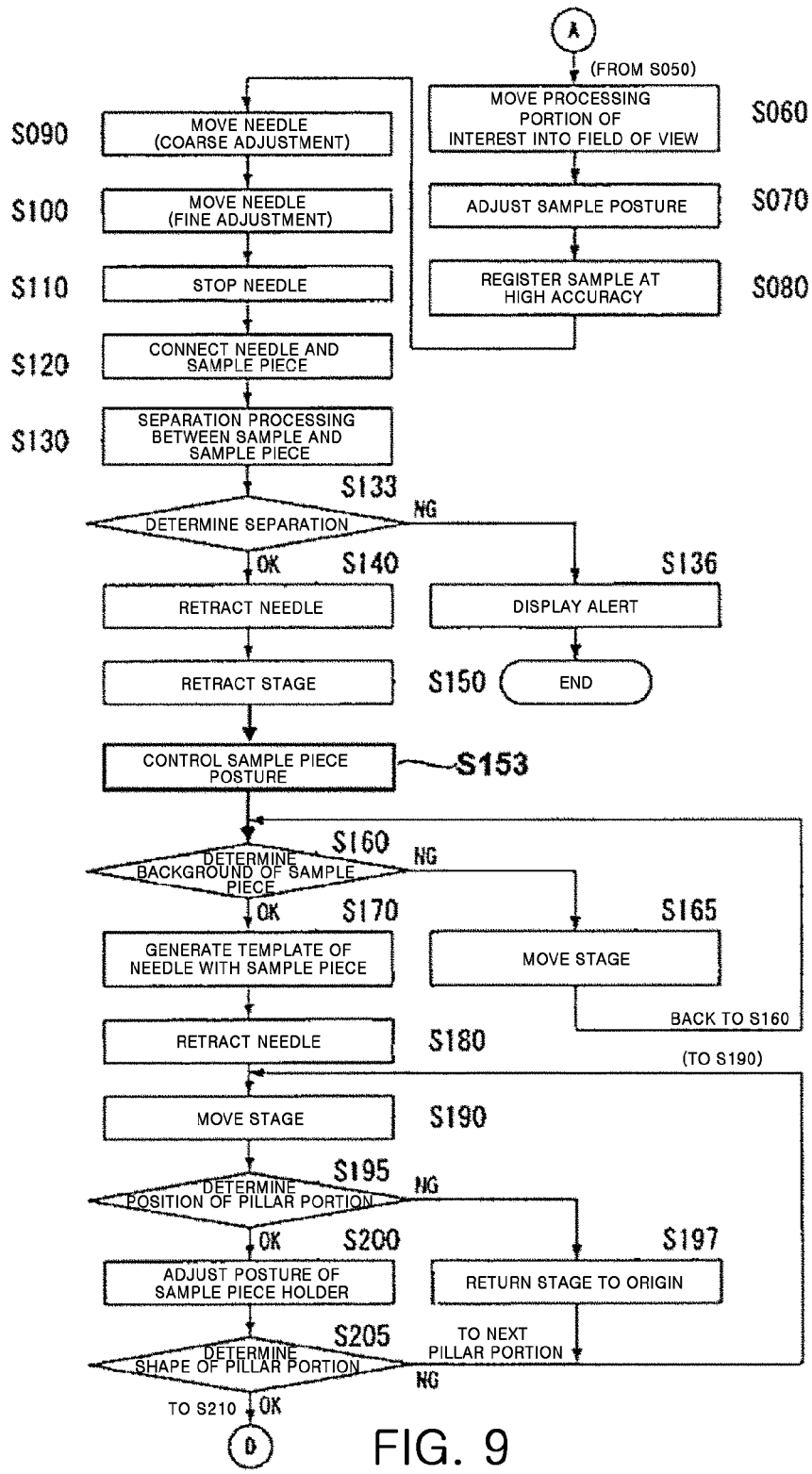
FIG. 9 is a flow chart of a sample piece pickup step, in particular, of the flow chart for illustrating the operation of the charged particle beam device according to the embodiment of the present invention.

FIG. 9 is a flow chart for illustrating, of the automatic sampling operation by the charged particle beam device 10 according to the embodiment of the present invention, a flow of a step of picking up the sample piece Q from the sample S. The term "picking up" as used herein refers to separating and isolating the sample piece Q from the sample S through processing with the focused ion beam or by the needle.

First, the computer 22 moves the stage 12 by the stage driving mechanism 13 so as to bring the sample piece Q of interest into the field of view of the charged particle beam. The stage driving mechanism 13 may be operated with the use of position coordinates of the target reference mark Ref.

Next, the computer 22 uses the image data of the charged particle beam to recognize the reference mark Ref previously formed in the sample S. The computer 22 uses the recognized reference mark Ref to recognize the position of the sample piece Q on the basis of a relative positional relationship between the known reference mark Ref and the sample piece Q, and moves the stage such that the position of the sample piece Q is brought into the observation field (Step S060).

Next, the computer 22 drives the stage 12 by the stage driving mechanism 13 to rotate the stage 12 about the Z axis by an angle corresponding to the posture control mode such that a posture of the sample piece Q becomes a predetermined posture (for example, posture suitable for extraction by the needle 18 (Step S070).

Next, the computer 22 uses the image data of the charged particle beam to recognize the reference mark Ref, and recognizes the position of the sample piece Q on the basis of the relative positional relationship between the known reference mark Ref and the sample piece Q to register the sample piece Q (Step S080). Next, the computer 22 performs the following processing as processing of bringing the needle 18 closer to the sample piece Q.

The computer 22 executes needle movement (coarse adjustment), in which the needle 18 is moved by the needle driving mechanism 19 (Step S090). The computer 22 uses the sets of image data obtained with the focused ion beam and the electron beam on the sample S to recognize the reference mark Ref (see FIG. 2 described above). The computer 22 uses the recognized reference mark Ref to set a movement target position AP of the needle 18.

Here, the movement target position AP is a position close to the sample piece Q. The movement target position AP is a position proximate to a side portion of the sample piece Q on a side opposite to the support portion Qa, for example. The computer 22 associates, with the movement target position AP, a predetermined positional relationship with respect to a processing frame F at the time of forming the sample piece Q. The computer 22 stores information on the relative positional relationship between the processing frame F at the time of forming the sample piece Q in the sample S through the irradiation with the focused ion beam, and the reference mark Ref. The computer 22 uses the recognized reference mark Ref and a relative positional relationship among the reference mark Ref, the processing frame F, and the movement target position AP (see FIG. 2) to move the tip end position of the needle 18 toward the movement target position AP in a three-dimensional space. When moving the needle 18 three-dimensionally, the computer 22 moves the needle 18 first in the X direction and the Y direction, and then in the Z direction, for example.

In moving the needle 18, the computer 22 can accurately grasp, with the use of the reference mark Ref, which is formed in the sample S when automatic processing for forming the sample piece Q is executed, the three-dimensional positional relationship between the needle 18 and the sample piece Q through observation with the electron beam and the focused ion beam from different directions, and can move the needle 18 appropriately.

In the above-mentioned processing, it has been described that the computer 22 moves the tip end position of the needle 18 within the three-dimensional space toward the movement target position AP with the use of the reference mark Ref and the relative positional relationship among the reference mark Ref, the processing frame F, and the movement target position AP, but the present invention is not limited thereto. The computer 22 may move the tip end position of the needle 18 within the three-dimensional space toward the movement target position AP without using the processing frame F and with the use of the relative positional relationship between the reference mark Ref and the movement target position AP.

Next, the computer 22 executes needle movement (fine adjustment), in which the needle 18 is moved by the needle driving mechanism 19 (Step S100). The computer 22 repeats the pattern matching using the template generated in Step S050, and uses the needle tip end coordinates obtained in Step S048 as the tip end position of the needle 18 in an SEM image to move the needle 18 from the movement target position AP to a connection processing position within the three-dimensional space under a state in which the irradiation area including the movement target position AP is irradiated with the charged particle beam.

Next, the computer 22 performs processing of stopping the movement of the needle 18 (Step S110).

Figure 10:
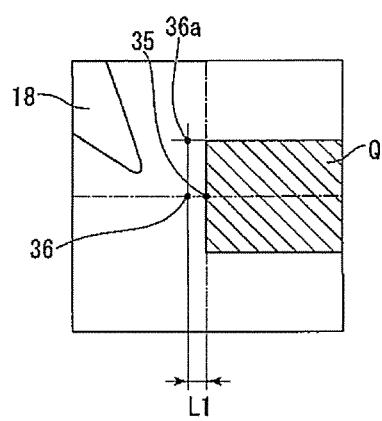
FIG. 10 is a schematic diagram for illustrating a stop position of the needle at a time when the needle is to be connected to the sample piece in the charged particle beam device according to the embodiment of the present invention.

FIG. 10 is a diagram for illustrating a positional relationship at the time of connecting the needle to the sample piece, and is an enlarged diagram of an end portion of the sample piece Q. In FIG. 10, the end portion (section) of the sample piece Q, to which the needle 18 is to be connected, is arranged at a center 35 of an SIM image, and a position at the center of a width of the sample piece Q that is separated from the center 35 of the SIM image by a predetermined distance L1 is defined as a connection processing position 36, for example. The connection processing position may be a position on an extension of an end surface of the sample piece Q (reference symbol 36a in FIG. 10). In this case, the deposition film is easily and conveniently deposited at the position. The computer 22 sets an upper limit of the predetermined distance L1 to 1 μm, and preferably sets the predetermined distance L1 to 100 nm or more and 400 nm or less. When the predetermined distance L1 is less than 100 nm, only the deposition film connecting the needle 18 and the sample piece Q cannot be cut in separating the needle 18 and the sample piece Q from each other in a subsequent step, and there is a high risk of also cutting the needle 18. The cutting of the needle 18 shortens the needle 18, and the needle tip end is deformed to be thicker. When the cutting is repeated, there is no choice but to replace the needle 18 contrary to performing automatic sampling repeatedly, which is the object of the present invention. In contrast, when the predetermined distance L1 exceeds 400 nm, the connection with the deposition film becomes insufficient, and there is an increased risk of failed isolation of the sample piece Q, with the result that repeated sampling is inhibited.

Moreover, although the position in a depth direction cannot be seen from FIG. 10, but the position is set in advance to a position that is half the width of the sample piece Q, for example. It should be noted, however, that the depth direction is not limited to the position. Three-dimensional coordinates of the connection processing position 36 are stored in the computer 22.

The computer 22 specifies the connection processing position 36, which is set in advance. The computer 22 operates the needle driving mechanism 19 to move the needle 18 to the predetermined connection processing position 36 on the basis of the three-dimensional coordinates of the tip end of the needle 18 and the connection processing position 36 within the same SIM image or SEM image. The computer 22 stops the needle driving mechanism 19 when the needle tip end matches the connection processing position 36.

Figure 11:
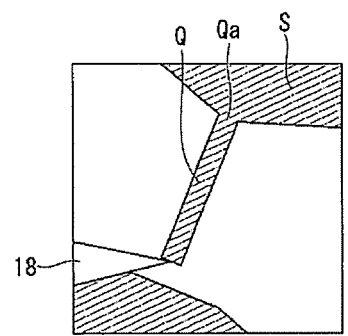
FIG. 11 is a diagram for illustrating the tip end of the needle and the sample piece in an image obtained with a focused ion beam in the charged particle beam device according to the embodiment of the present invention.
Figure 12:
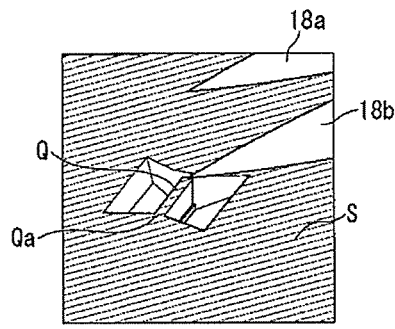
FIG. 12 is a diagram for illustrating the tip end of the needle and the sample piece in an image obtained with an electron beam in the charged particle beam device according to the embodiment of the present invention.

In FIG. 11 and FIG. 12, the way the needle 18 is brought closer to the sample piece Q is illustrated as a diagram for illustrating an image obtained with the focused ion beam in the charged particle beam device 10 according to the embodiment of the present invention (FIG. 11), and as a diagram for illustrating an image obtained with the electron beam (FIG. 12). In FIG. 12, appearances of the needle before and after the fine adjustment are shown, in which a needle 18a in FIG. 12 shows the needle 18 at the movement target position, and a needle 18b shows the needle 18 after the fine adjustment of the needle 18, which has been moved to the connection processing position 36, and is the same needle 18. FIG. 11 and FIG. 12 are different in observation direction between the focused ion beam and the electron beam, and in observation magnification, but are the same in the observation target and the needle 18.

With the above-mentioned method of moving the needle 18, the needle 18 can be brought closer to, and stopped at, the connection processing position 36 in the vicinity of the sample piece Q accurately and quickly.

Next, the computer 22 performs processing of connecting the needle 18 to the sample piece Q (Step S120). The computer 22 irradiates the irradiation area including a processing frame R1 set at the connection processing position 36 with the focused ion beam while supplying a carbon-based gas, which is the deposition gas, to the sample piece Q and the tip end surface of the needle 18 by the gas supply portion 17 for predetermined deposition time. In this manner, the computer 22 connects the sample piece Q and the needle 18 to each other with the deposition film.

Figure 13:
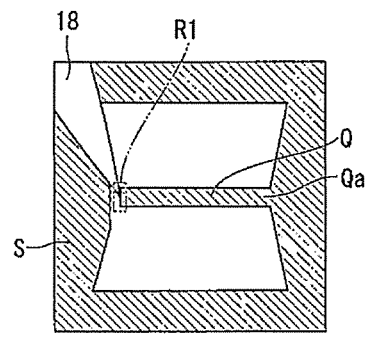
FIG. 13 is a diagram for illustrating a processing frame including a connection processing position of the needle and the sample piece in an image obtained with the focused ion beam in the charged particle beam device according to the embodiment of the present invention.
Figure 14:
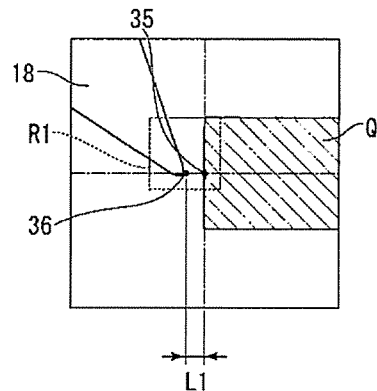
FIG. 14 is a schematic diagram for illustrating a positional relationship between the needle and the sample piece, and a deposition film forming area at the time when the needle is to be connected to the sample piece in the charged particle beam device according to the embodiment of the present invention.

In Step S120, the computer 22 performs the connection with the deposition film at a position at which the needle 18 is not brought into direct contact with, and is spaced apart from, the sample piece Q. Therefore, the needle 18 is not cut when the needle 18 and the sample piece Q are separated from each other by the irradiation with the focused ion beam in a subsequent step. There is also an advantage that occurrence of a problem, for example, a damage caused by the direct contact of the needle 18 with the sample piece Q can be prevented. Further, if the needle 18 vibrates, transfer of the vibration to the sample piece Q can be suppressed. Further, even when movement of the sample piece Q caused by creeping of the sample S occurs, it is possible to suppress occurrence of excessive distortion between the needle 18 and the sample piece Q. This is shown in FIG. 13, which is a diagram for illustrating the processing frame R1 (deposition film forming area) including the connection processing position of the needle 18 and the sample piece Q in image data obtained with the focused ion beam in the charged particle beam device 10 according to the embodiment of the present invention. FIG. 14 is an enlarged explanatory diagram of FIG. 13 for facilitating understanding of a positional relationship among the needle 18, the sample piece Q, and the deposition film forming area (for example, processing frame R1). The needle 18 approaches and stops with a position spaced apart from the sample piece Q by the predetermined distance L1 being the connection processing position. The deposition film forming area (for example, processing frame R1) is set so as to straddle the needle 18 and the sample piece Q. The deposition film is formed also in the space of the predetermined distance L1, and the needle 18 and the sample piece Q are connected to each other with the deposition film.

In connecting the needle 18 to the sample piece Q, the computer 22 selects a connection posture corresponding to each approach mode selected in advance in Step S010 when the sample piece Q connected to the needle 18 is later transferred to the sample piece holder P. The computer 22 selects a relative connection posture between the needle 18 and the sample piece Q to correspond to each of a plurality of (for example, three) different approach modes, which are to be described later.

The computer 22 may determine the state of connection with the deposition film by detecting a change in absorption current of the needle 18. The computer 22 may determine that the sample piece Q and the needle 18 are connected to each other with the deposition film when the absorption current of the needle 18 reaches a predetermined current value, and may stop forming the deposition film irrespective of whether the predetermined deposition time has elapsed.

Next, the computer 22 performs processing of cutting the support portion Qa between the sample piece Q and the sample S (Step S130). The computer 22 uses the reference mark Ref formed in the sample S to specify a preset cutting processing position T1 of the support portion Qa.

Figure 15:
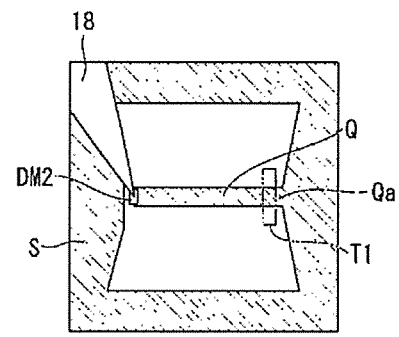
FIG. 15 is a diagram for illustrating the sample and a cutting processing position T1 of a support portion of the sample piece in an image obtained with the focused ion beam in the charged particle beam device according to the embodiment of the present invention.

The computer 22 separates the sample piece Q from the sample S by irradiating the cutting processing position T1 with the focused ion beam for predetermined cutting processing time. This is shown in FIG. 15, which is a diagram for illustrating the sample S and the cutting processing position T1 of the support portion Qa of the sample piece Q in image data obtained with the focused ion beam in the charged particle beam device 10 according to the embodiment of the present invention.

The computer 22 senses conduction between the sample S and the needle 18 to determine whether the sample piece Q is cut away from the sample S (Step S133).

When sensing no conduction between the sample S and the needle 18, the computer 22 determines that the sample piece Q is cut away from the sample S (OK), and continues execution of the subsequent processing (that is, Step S140 and subsequent processing). In contrast, when sensing conduction between the sample S and the needle 18 after finishing the cutting processing, that is, after completing cutting of the support portion Qa between the sample piece Q and the sample S at the cutting processing position T1, the computer 22 determines that the sample piece Q is not cut away from the sample S (NG). When determining that the sample piece Q is not cut away from the sample S (NG), the computer 22 provides a notification that the separation between the sample piece Q and the sample S is not complete through display on the display device 21 or an alarm sound, for example (Step S136). Then, execution of the subsequent processing is stopped. In this case, the computer 22 may cut the deposition film (deposition film DM2 to be described later) connecting the sample piece Q and the needle 18 by the irradiation with the focused ion beam to separate the sample piece Q and the needle 18, and return the needle 18 to an initial position (Step S060). The needle 18 that has been returned to the initial position samples the next sample piece Q.

Figure 16:
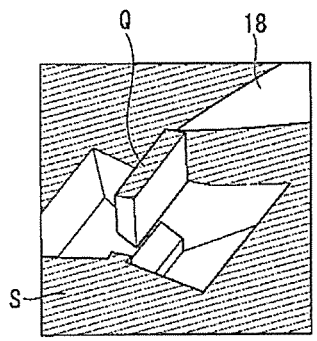
FIG. 16 is a diagram for illustrating a state under which the needle having the sample piece connected thereto is being retracted in an image obtained with the electron beam in the charged particle beam device according to the embodiment of the present invention.

Next, the computer 22 performs needle retraction processing (Step S140). The computer 22 raises the needle 18 upward in the vertical direction (that is, positive direction of the Z direction) by the predetermined distance (for example, 5 μm) by the needle driving mechanism 19. This is shown in FIG. 16, which is a diagram for illustrating a state under which the needle 18 having the sample piece Q connected thereto is retracted in image data obtained with the electron beam in the charged particle beam device 10 according to the embodiment of the present invention.

Figure 17:
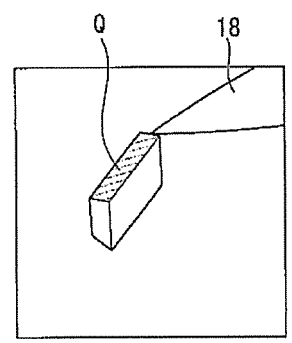
FIG. 17 is a diagram for illustrating a state under which a stage is retracted from the needle having the sample piece connected thereto in an image obtained with the electron beam in the charged particle beam device according to the embodiment of the present invention.

Next, the computer 22 performs stage retraction processing (Step S150). As illustrated in FIG. 17, the computer 22 moves the stage 12 by the predetermined distance by the stage driving mechanism 13. For example, the computer 22 lowers the stage 12 downward in the vertical direction (that is, negative direction of the Z direction) by 1 mm, 3 mm, or 5 mm. After lowering the stage 12 by the predetermined distance, the computer 22 moves the nozzle 17a of the gas supply portion 17 away from the stage 12. For example, the computer 22 raises the nozzle 17a to a standby position located above in the vertical direction. This is shown in FIG. 17, which is a diagram for illustrating a state under which the stage 12 is retracted with respect to the needle 18 having the sample piece Q connected thereto in image data obtained with the electron beam in the charged particle beam device 10 according to the embodiment of the present invention.

Next, the computer 22 performs processing of controlling the posture of the sample piece Q (Step S153). The computer 22 can axially rotate the needle 18 by the needle driving mechanism 19, and hence can control the posture of the sample piece Q as required. The computer 22 rotates the sample piece Q connected to the needle 18 about the axis of the needle 18 to change up and down or right and left of the sample piece Q with respect to the sample piece holder P. For example, the computer 22 sets the posture of the sample piece Q so that an original surface of the sample S on the sample piece Q establishes a relationship that is perpendicular or parallel to an end surface of the pillar portion 34. In this manner, the computer 22 can ensure the posture of the sample piece Q that is suitable for shaping processing and finish processing, which are to be executed later, for example, and reduce, for example, the effect of the shower-curtain effect generated during thinning finish processing of the sample piece Q. The shower-curtain effect is a processing fringe pattern generated in the focused ion beam irradiation direction, and when the completed sample piece Q is observed with an electron microscope, may give an erroneous interpretation. Therefore, through ensuring an appropriate posture of the sample piece Q, reliability of the observation can be increased. The computer 22 corrects the rotation so that the sample piece Q does not fall out of an actual field of view by performing decentering correction when the needle 18 is axially rotated.

In this posture control, the computer 22 first drives the needle 18 by the needle driving mechanism 19 to axially rotate the needle 18 by a rotation angle in a posture control mode corresponding to the approach mode such that the posture of the sample piece Q becomes a predetermined posture corresponding to the approach mode. The "posture control mode corresponding to the approach mode" here is a mode in which the posture of the sample piece Q is controlled to the predetermined posture corresponding to the approach mode with respect to the sample piece holder P. In this posture control mode, the computer 22 controls the posture of the sample piece Q by axially rotating the needle 18, which has approached the sample piece Q at the predetermined angle and to which the sample piece Q has been connected in the sample piece pickup step described above, to a predetermined rotation angle. The approach mode is a mode of approaching, to the sample piece holder P, the sample piece Q that has been controlled to the predetermined posture in the posture control mode. The computer 22 performs decentering correction when the needle 18 is axially rotated. This is shown in FIG. 18 to FIG. 23, which are diagrams for illustrating states of the needle 18 having the sample piece Q connected thereto in the plurality of (for example, three) different approach modes.

Figure 18:
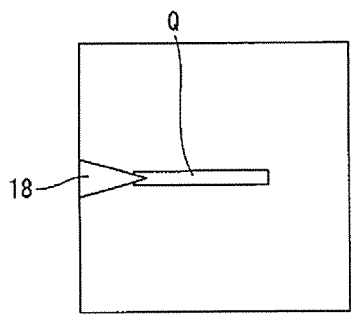
FIG. 18 is a diagram for illustrating a state of an approach mode with a rotation angle of the needle having the sample piece connected thereto being 0° in image data obtained with the focused ion beam in the charged particle beam device according to the embodiment of the present invention.
Figure 19:
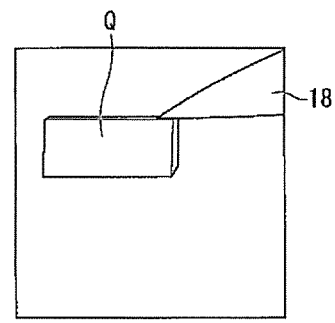
FIG. 19 is a diagram for illustrating the state of the approach mode with the rotation angle of the needle having the sample piece connected thereto being 0° in an image obtained with the electron beam in the charged particle beam device according to the embodiment of the present invention.

FIG. 18 and FIG. 19 are diagrams for illustrating, in an approach mode with a rotation angle of the needle 18 being 0°, a state of the needle 18 having the sample piece Q connected thereto in image data obtained with the focused ion beam in the charged particle beam device 10 according to the embodiment of the present invention (FIG. 18), and the state of the needle 18 having the sample piece Q connected thereto in image data obtained with the electron beam (FIG. 19). In the approach mode with the rotation angle of the needle 18 being 0°, the computer 22 sets a posture state suitable for transferring the sample piece Q to the sample piece holder P without rotating the needle 18.

Figure 20:
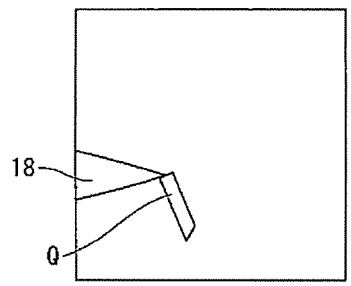
FIG. 20 is a diagram for illustrating a state of an approach mode with a rotation angle of the needle having the sample piece connected thereto being 90° in an image obtained with the focused ion beam in the charged particle beam device according to the embodiment of the present invention.
Figure 21:
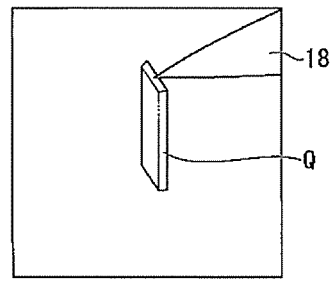
FIG. 21 is a diagram for illustrating the state of the approach mode with the rotation angle of the needle having the sample piece connected thereto being 90° in an image obtained with the electron beam in the charged particle beam device according to the embodiment of the present invention.

FIG. 20 and FIG. 21 are diagrams for illustrating, in an approach mode with a rotation angle of the needle 18 being 90°, a state under which the needle 18 having the sample piece Q connected thereto is rotated by 90° in image data obtained with the focused ion beam in the charged particle beam device 10 according to the embodiment of the present invention (FIG. 20), and a state under which the needle 18 having the sample piece Q connected thereto is rotated by 90° in image data obtained with the electron beam (FIG. 21). In the approach mode with the rotation angle of the needle 18 being 90°, the computer 22 sets a posture state suitable for transferring the sample piece Q to the sample piece holder P under the state under which the needle 18 is rotated by 90°.

Figure 22:
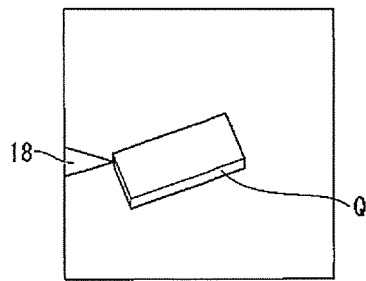
FIG. 22 is a diagram for illustrating a state of an approach mode with a rotation angle of the needle having the sample piece connected thereto being 180° in an image obtained with the focused ion beam in the charged particle beam device according to the embodiment of the present invention.
Figure 23:
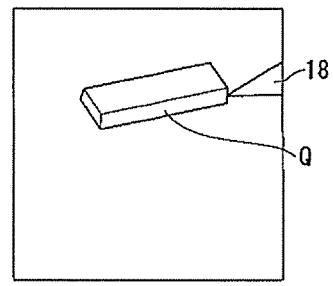
FIG. 23 is a diagram for illustrating the state of the approach mode with the rotation angle of the needle having the sample piece connected thereto being 180° in an image obtained with the electron beam in the charged particle beam device according to the embodiment of the present invention.

FIG. 22 and FIG. 23 are diagrams for illustrating, in an approach mode with a rotation angle of the needle 18 being 180°, a state under which the needle 18 having the sample piece Q connected thereto is rotated by 180° in image data obtained with the focused ion beam in the charged particle beam device 10 according to the embodiment of the present invention (FIG. 22), and a state under which the needle 18 having the sample piece Q connected thereto is rotated by 180° in image data obtained with the electron beam (FIG. 23). In the approach mode with the rotation angle of the needle 18 being 180°, the computer 22 sets a posture state suitable for transferring the sample piece Q to the sample piece holder P under the state under which the needle 18 is rotated by 180°.

The relative connection posture between the needle 18 and the sample piece Q is set in advance, when the needle 18 is made to approach the sample piece Q at the predetermined angle to connect the needle 18 to the sample piece Q in the sample piece pickup step described above, to the connection posture suitable for each posture control mode.

The computer 22 operates the stage driving mechanism 13 so as to establish the state under which there is no structure in the background of the needle 18 and the sample piece Q, which are connected to each other. This is for reliably recognizing, when the template of the needle 18 and the sample piece Q is generated in the subsequent processing (Step S170), edges (contour) of the needle 18 and the sample piece Q from the image data of the sample piece Q obtained with each of the focused ion beam and the electron beam. The computer 22 moves the stage 12 by the predetermined distance. The background of the sample piece Q is determined (Step S160). When there is no problem in the background, the processing proceeds to the next Step S170. When there is a problem in the background, the stage 12 is moved again by the predetermined amount (Step S165), and the processing returns to the determination (Step S160) of the background, and is repeated until there is no problem in the background.

The computer 22 executes the generation of the template of the needle 18 and the sample piece Q (Step S170). The computer 22 generates the template of the needle 18 and the sample piece Q under a posture state under which the needle 18 having the sample piece Q fixed thereto is rotated as required (that is, posture in which the sample piece Q is connected to the pillar portion 34 of the sample table 33). In this manner, the computer 22 three-dimensionally recognizes the edges (contour) of the needle 18 and the sample piece Q from the image data obtained with each of the focused ion beam and the electron beam depending on the rotation of the needle 18. The computer 22 may recognize, in the approach mode with the rotation angle of the needle 18 being 0°, the edges (contour) of the needle 18 and the sample piece Q from the image data obtained with the focused ion beam without requiring the electron beam.

When instructing the stage driving mechanism 13 or the needle driving mechanism 19 to move the stage 12 to the position at which there is no structure in the background of the needle 18 and the sample piece Q, the computer 22 sets the observation magnification to a low magnification to find the needle 18 when the needle 18 has not reached to an actually specified place, and initializes position coordinates of the needle 18 and moves the needle 18 to the initial position when the needle 18 is not found.

In the template generation (Step S170), the computer 22 first acquires a template (reference image data) for template matching on the sample piece Q and the tip shape of the needle 18 having the sample piece Q connected thereto. The computer 22 irradiates the needle 18 with the charged particle beam (each of the focused ion beam and the electron beam) while scanning the irradiation position. The computer 22 acquires sets of the image data from the plurality of different directions of the secondary charged particles R (such as secondary electrons) emitted from the needle 18 by being irradiated with the charged particle beam. The computer 22 acquires the sets of image data by the irradiation with the focused ion beam and the irradiation with the electron beam. The computer 22 stores the sets of image data acquired from two different directions as a template (reference image data).

The computer 22 uses, as the reference image data, the image data actually acquired for the sample piece Q actually processed with the focused ion beam and the needle 18 having the sample piece Q connected thereto, and hence can perform accurate pattern matching irrespective of the shape of the sample piece Q and the needle 18.

In acquiring the sets of image data, the computer 22 uses suitable image acquisition conditions, such as a magnification, brightness, and contrast, stored in advance to increase recognition accuracy of the shape of the sample piece Q and the needle 18 having the sample piece Q connected thereto.

Next, the computer 22 performs needle retraction processing (Step S180). This is performed in order to prevent unintended contact with the stage 12 during the subsequent stage movement. The computer 22 moves the needle 18 by the predetermined distance by the needle driving mechanism 19. For example, the computer 22 raises the needle 18 upward in the vertical direction (that is, positive direction in the Z direction). In contrast, the needle 18 is stopped at the position, and the stage 12 is moved by the predetermined distance. For example, the computer 22 may lower the stage 12 downward in the vertical direction (that is, negative direction of the Z direction). The needle retraction direction is not limited to the vertical direction described above, and may be the needle axis direction, or other predetermined retraction position, as long as the sample piece Q attached to the needle tip end is at the predetermined position at which the sample piece Q is not brought into contact with a structure inside the sample chamber or is not irradiated with the focused ion beam.

Figure 24:
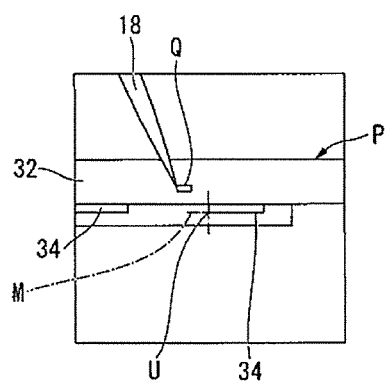
FIG. 24 is a diagram for illustrating an attachment position of the sample piece on a pillar portion in an image obtained with the focused ion beam in the charged particle beam device according to the embodiment of the present invention.
Figure 25:
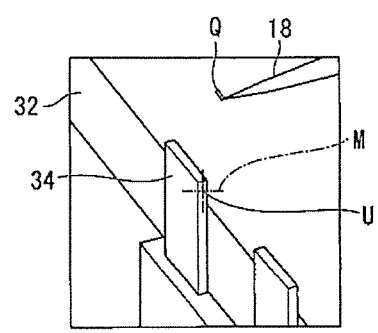
FIG. 25 is a diagram for illustrating the attachment position of the sample piece on the pillar portion in an image obtained with the electron beam in the charged particle beam device according to the embodiment of the present invention.

Next, the computer 22 moves the stage 12 by the stage driving mechanism 13 such that the particular sample piece holder P registered in Step S020 described above is brought into the observation field area with the charged particle beam (Step S190). This is shown in FIG. 24 and FIG. 25. In particular, FIG. 24 is a schematic diagram of an image obtained with the focused ion beam in the charged particle beam device 10 according to the embodiment of the present invention, and is a diagram for illustrating an attachment position U of the sample piece Q on the pillar portion 34, and FIG. 25 is a schematic diagram of an image obtained with the electron beam, and is a diagram for illustrating the attachment position U of the sample piece Q on the pillar portion 34.

Now, it is determined whether a desired pillar portion 34 of a sample piece holder P is brought into the observation field area (Step S195), and when the desired pillar portion 34 is brought into the observation field area, the processing proceeds to the next Step S200. If the desired pillar portion 34 is not brought into the observation field area, that is, when the stage driving does not operate properly with respect to the specified coordinates, stage coordinates specified immediately before are initialized so as to return to an origin position of the stage 12 (Step S197). Then, coordinates of the desired pillar portion 34 that is registered in advance are specified again to drive the stage 12 (Step S190), and the processing is repeated until the pillar portion 34 is brought into the observation field area.

Next, the computer 22 moves the stage 12 by the stage driving mechanism 13 to adjust a horizontal position of the sample piece holder P, and rotates and tilts the stage 12 by an angle corresponding to the posture control mode so that a posture of the sample piece holder P becomes a predetermined posture (Step S200).

Through Step S200, the postures of the sample piece Q and the sample piece holder P can be adjusted such that an end surface of the original surface of the sample S establishes the relationship that is parallel or perpendicular to the end surface of the pillar portion 34. In particular, assuming a case of subjecting the sample piece Q fixed to the pillar portion 34 to thinning processing with the focused ion beam, it is preferred to adjust the postures of the sample piece Q and the sample piece holder P such that the end surface of the original surface of the sample S and the focused ion beam irradiation axis establish the perpendicular relationship. It is also preferred to adjust the postures of the sample piece Q and the sample piece holder P such that the sample piece Q to be fixed to the pillar portion 34 is on a downstream side of an incident direction of the focused ion beam with the end surface of the original surface of the sample S being perpendicular to the pillar portion 34.

Now, it is determined whether the shape of the pillar portion 34 of the sample piece holder P is good (Step S205). It is determined in Step S205 whether, although the images of the pillar portion 34 are registered in Step S023, the specified pillar portion 34 is not deformed, damaged, or lacked by unintended contact or the like in the subsequent steps, and hence whether the shape of the pillar portion 34 is good. In Step S205, when it is determined that the shape of the pillar portion 34 has no problem and is good, the processing proceeds to the next Step S210, and when it is determined that the shape is bad, the processing returns to Step S190, in which the stage is moved such that the next pillar portion 34 is brought into the observation field area.

When the computer 22 instructs the stage driving mechanism 13 to move the stage 12 so as to bring the specified pillar portion 34 into the observation field area, and when the specified pillar portion 34 is not actually brought into the observation field area, the computer initializes position coordinates of the stage 12 to move the stage 12 to the initial position.

Then, the computer 22 moves the nozzle 17a of the gas supply portion 17 to near the focused ion beam irradiation position. For example, the computer 22 lowers the nozzle 17a from the standby position located above in the vertical direction of the stage 12 to the processing position.

<Sample Piece Mounting Step>

The "sample piece mounting step" as used herein refers to a step of transferring the isolated sample piece Q to the sample piece holder P.

Figure 26:
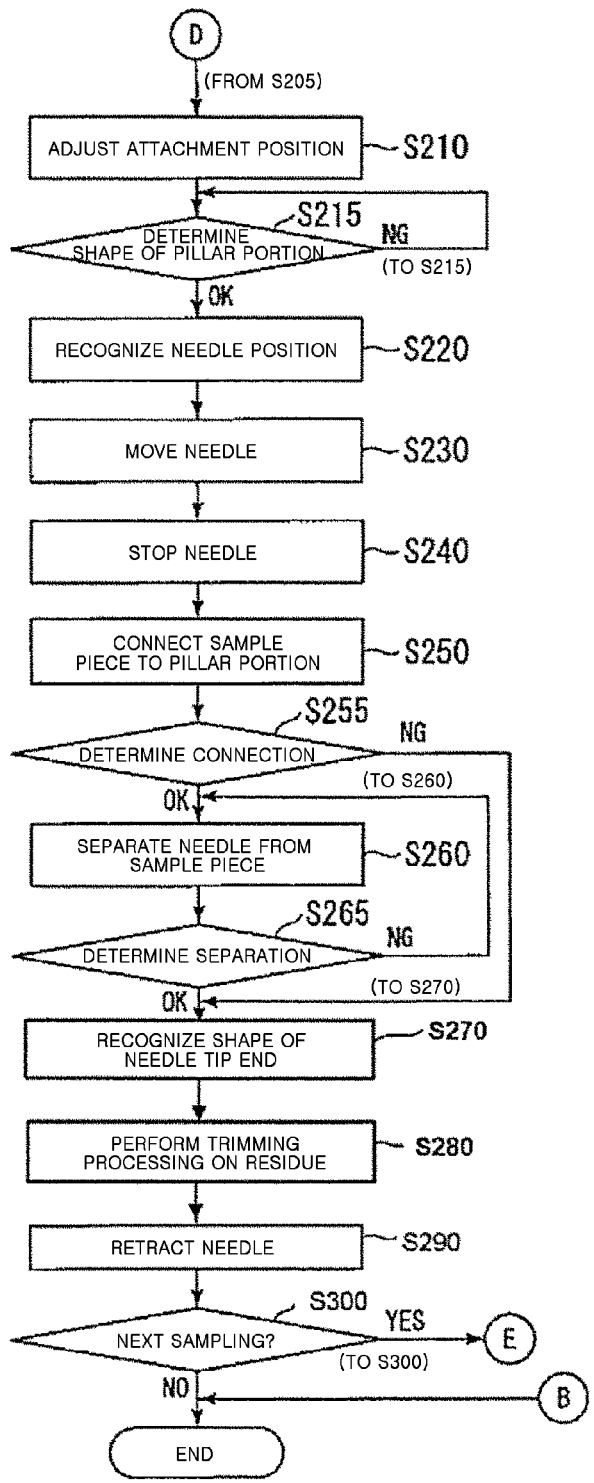
FIG. 26 is a flow chart of a sample piece mounting step, in particular, of the flow chart for illustrating the operation of the charged particle beam device according to the embodiment of the present invention.

FIG. 26 is a flow chart for illustrating a flow of a step of mounting (transferring) the sample piece Q to a predetermined pillar portion 34 of a predetermined sample piece holder P, of the automatic sampling operation by the charged particle beam device 10 according to the embodiment of the present invention.

The computer 22 uses the sets of image data obtained by the irradiation with the focused ion beam and the electron beam to recognize a transfer position of the sample piece Q, which is stored in Step S020 described above (Step S210). The computer 22 executes the template matching of the pillar portion 34. The computer 22 performs the template matching to confirm that the pillar portion 34 that has appeared in the observation field area of the plurality of pillar portions 34 of the sample table 33 having the comb-tooth shape is the pillar portion 34 specified in advance. The computer 22 uses the template for each pillar portion 34, which is generated in the step of generating the template of the pillar portion 34 in advance (Step S020), to perform the template matching with the sets of image data obtained by the irradiation with the focused ion beam and the electron beam.

Moreover, the computer 22 determines, in the template matching for each pillar portion 34, which is performed after the stage 12 is moved, whether lack or other problem is found in the pillar portion 34 (Step S215). When a problem is found in the shape of the pillar portion 34 (NG), the pillar portion 34 to which the sample piece Q is to be transferred is changed to a pillar portion 34 next to the pillar portion 34 in which the problem is found, and the template matching is performed also for the pillar portion 34 to determine the pillar portion 34 to which the sample piece Q is to be transferred. When there is no problem in the shape of the pillar portion 34, the processing proceeds to the next Step S220.

Moreover, the computer 22 may extract the edges (contour) from image data in a predetermined region (region at least including the pillar portion 34), and use the edge pattern as a template. Moreover, when the edges (contour) cannot be extracted from the image data of the predetermined region (region at least including the pillar portion 34), the computer 22 acquires the image data again. The extracted edges may be displayed on the display device 21, and may be subjected to template matching with the image obtained with the focused ion beam or the image obtained with the electron beam in the observation field area.

The computer 22 drives the stage 12 by the stage driving mechanism 13 such that the attachment position recognized by the irradiation with the electron beam and the attachment position recognized by the irradiation with the focused ion beam match. The computer 22 drives the stage 12 by the stage driving mechanism 13 such that the attachment position U of the sample piece Q matches the center (processing position) of the field of view in a field-of-view area.

Next, the computer 22 performs, as processing of bringing the sample piece Q connected to the needle 18 into contact with the sample piece holder P, the following processing of Step S220 to Step S250.

The computer 22 first recognizes the position of the needle 18 (Step S220). The computer 22 irradiates the needle 18 with the charged particle beam to detect the absorption current that flows into the needle 18, to thereby generate the absorption current image data. The computer 22 acquires irradiation with sets of absorption current image data with the focused ion beam and the irradiation with the electron beam. The computer 22 uses the sets of absorption current image data from two different directions to detect the tip end position of the needle 18 in the three-dimensional space.

The computer 22 may drive the stage 12 by the stage driving mechanism 13 with the use of the detected tip end position of the needle 18 to set the tip end position of the needle 18 to a preset center position (center of the field of view) of the field-of-view area.

Next, the computer 22 executes the sample piece mounting step. The computer 22 first performs template matching in order to accurately recognize the position of the sample piece Q connected to the needle 18. The computer 22 performs the template matching in the sets of image data obtained by the irradiation with the focused ion beam and the electron beam, respectively, with the use of the template of the needle 18 and the sample piece Q connected to each other, which is generated in advance in the step (Step S170) of generating the template of the needle 18 and the sample piece Q.

In extracting the edges (contour) from a predetermined region (region at least including the needle 18 and the sample piece Q) of the image data in the template matching, the computer 22 displays the extracted edges on the display device 21. Moreover, when the edges (contour) cannot be extracted from the predetermined region (region at least including the needle 18 and the sample piece Q) of the image data in the template matching, the computer 22 acquires the image data again.

Then, the computer 22 measures a distance between the sample piece Q and the pillar portion 34 in the sets of image data obtained by the irradiation with the focused ion beam and the electron beam on the basis of the template matching using the template of the needle 18 and the sample piece Q connected to each other, and the template of the pillar portion 34 to which the sample piece Q is to be attached.

Then, the computer 22 finally transfers the sample piece Q to the pillar portion 34, to which the sample piece Q is to be attached, only through movement within a plane parallel to the stage 12.

In the sample piece mounting step, the computer 22 first executes needle movement in which the needle 18 is moved by the needle driving mechanism 19 (Step S230). The computer 22 measures the distance between the sample piece Q and the pillar portion 34 in the sets of image data obtained by the irradiation with the focused ion beam and the electron beam on the basis of the template matching using the template of the needle 18 and the sample piece Q and the template of the pillar portion 34. The computer 22 moves the needle 18 toward the attachment position of the sample piece Q inside the three-dimensional space depending on the measured distance.

Next, the computer 22 stops the needle 18 with interposition of a predetermined gap L2 between the pillar portion 34 and the sample piece Q (Step S240). The computer 22 sets the gap L2 to 1 μm or less, and preferably sets the gap L2 to 100 nm or more and 500 nm or less.

The connection can be established even when the gap L2 is 500 nm or more. However, time required to connect the pillar portion 34 and the sample piece Q with the deposition film is increased to a predetermined value or more, and hence 1 μm is not preferred. As the gap L2 becomes smaller, time required to connect the pillar portion 34 and the sample piece Q with the deposition film becomes shorter, but it is critical not to bring the pillar portion 34 and the sample piece Q into contact with each other.

When providing the gap L2, the computer 22 may provide the gap between the pillar portion 34 and the needle 18 by sensing the absorption current image of the pillar portion 34 and the needle 18.

The computer 22 senses whether or not the sample piece Q and the needle 18 are disconnected from each other by sensing the conduction between the pillar portion 34 and the needle 18 or the absorption current image of the pillar portion 34 and the needle 18 after transferring the sample piece Q to the pillar portion 34.

When the conduction between the pillar portion 34 and the needle 18 cannot be sensed, the computer 22 switches processing to sense the absorption current image of the pillar portion 34 and the needle 18.

Figure 27:
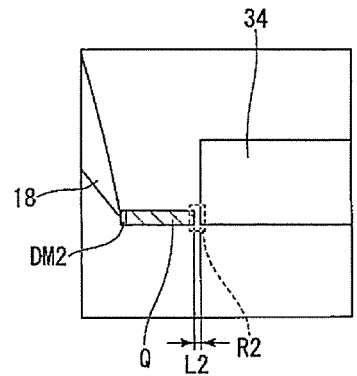
FIG. 27 is a diagram for illustrating the needle that has stopped moving in the vicinity of an attachment position of the sample piece on a sample table in an image obtained with the focused ion beam in the charged particle beam device according to the embodiment of the present invention.
Figure 28:
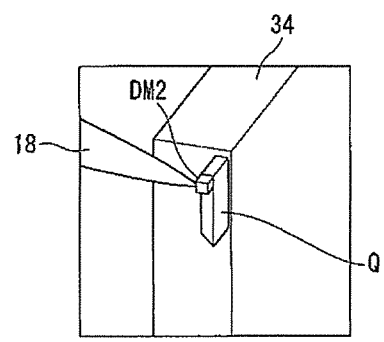
FIG. 28 is a diagram for illustrating the needle that has stopped moving in the vicinity of the attachment position of the sample piece on the sample table in an image obtained with the electron beam in the charged particle beam device according to the embodiment of the present invention.

Next, the computer 22 performs processing of connecting, to the pillar portion 34, the sample piece Q connected to the needle 18 (Step S250). FIG. 27 and FIG. 28 are schematic diagrams of images with an observation magnification being increased from that of FIG. 24 and FIG. 25, respectively. The computer 22 brings the sample piece Q and the pillar portion 34 closer to each other such that one side of the sample piece Q and one side of the pillar portion 34 are in line as in FIG. 27, and such that an upper end surface of the sample piece Q and an upper end surface of the pillar portion 34 are in the same plane as in FIG. 28. When the gap L2 becomes a predetermined value, the computer 22 stops the needle driving mechanism 19. Under a stopped state at the attachment position of the sample piece Q with the gap L2, the computer 22 sets a processing frame R2 for deposition so as to include an end portion of the pillar portion 34 in the image obtained with the focused ion beam of FIG. 27. The computer 22 irradiates the irradiation area including the processing frame R2 with the focused ion beam for predetermined time while supplying the gas to the surfaces of the sample piece Q and the pillar portion 34 by the gas supply portion 17. With this operation, the deposition film is formed on the portion irradiated with the focused ion beam to fill the gap L2 and connect the sample piece Q to the pillar portion 34. In a step of fixing the sample piece Q to the pillar portion 34 by deposition, the computer 22 ends deposition when the conduction between the pillar portion 34 and the needle 18 is sensed.

The computer 22 determines completion of the connection between the sample piece Q and the pillar portion 34 (Step S255). Step S255 is performed as follows, for example. An ohmmeter is mounted in advance between the needle 18 and the stage 12 to detect conduction therebetween. When the needle 18 and the stage 12 are spaced apart (over the gap L2), an electrical resistance is infinite. However, when the needle 18 and the stage 12 are covered with a conductive deposition film to fill the gap L2, an electrical resistance value therebetween is gradually reduced, and when it is confirmed that the electrical resistance value becomes a predetermined resistance value or less, it is determined that electric connection is established. Moreover, based on prior consideration, when the resistance value between the needle 18 and the stage 12 reaches the predetermined resistance value, the deposition film has sufficient mechanical strength, and it can be determined that the sample piece Q is sufficiently connected to the pillar portion 34.

Without limiting to the electrical resistance described above, an electric current, a voltage, or the like may be sensed as long as an electrical characteristic between the pillar portion and the sample piece Q can be measured. Moreover, when the predetermined electrical characteristic (electrical resistance value, current value, potential, or the like) is not satisfied within predetermined time, the computer 22 extends time for forming the deposition film. Moreover, the computer 22 may determine in advance optimal time in which the deposition film can be formed for the gap L2 between the pillar portion 34 and the sample piece Q, irradiation beam conditions, and gas species for the deposition film, the deposition forming time is stored, and the formation of the deposition film can be stopped after predetermined time.

Figure 29:
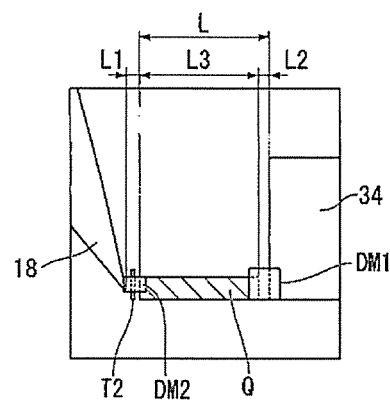
FIG. 29 is a diagram for illustrating the needle that has stopped moving in the vicinity of the attachment position of the sample piece on the sample table in the image obtained with the electron beam in the charged particle beam device according to the embodiment of the present invention.

At a time point when the connection between the sample piece Q and the pillar portion 34 is confirmed, the computer 22 stops the gas supply and the irradiation with the focused ion beam. This is shown in FIG. 29, which is a diagram for illustrating a deposition film DM1 that connects, to the pillar portion 34, the sample piece Q connected to the needle 18 in image data obtained with the focused ion beam in the charged particle beam device 10 according to the embodiment of the present invention.

In Step S255, the computer 22 may determine the state of connection with the deposition film DM1 by detecting a change in absorption current of the needle 18.

When determining that the sample piece Q and the pillar portion 34 are connected with the deposition film DM1 on the basis of a change in absorption current of the needle 18, the computer 22 may stop forming the deposition film DM1 irrespective of whether the predetermined time has elapsed. When the completion of the connection is confirmed, the processing proceeds to the next Step S260. When the connection is not complete, the irradiation with the focused ion beam and the gas supply are stopped after the predetermined time, the deposition film DM2 that connects the sample piece Q and the needle 18 is cut with the focused ion beam, and the sample piece Q at the needle tip end is discarded. The processing proceeds to an operation of retracting the needle (Step S270).

Next, the computer 22 performs processing of cutting the deposition film DM2 that connects the needle 18 and the sample piece Q to separate the sample piece Q and the needle 18 from each other (Step S260).

This is shown in FIG. 29 described above, which is a diagram for illustrating a cutting processing position T2 for cutting the deposition film DM2 that connects the needle 18 and the sample piece Q in the image data obtained with the focused ion beam in the charged particle beam device 10 according to the embodiment of the present invention. The computer 22 sets, as the cutting processing position T2, a position separated from a side surface of the pillar portion 34 by a sum (L+L1/2) of the predetermined distance (that is, a sum of the gap L2 from the side surface of the pillar portion 34 to the sample piece Q and a size L3 of the sample piece Q) L and a half of the predetermined distance L1 of the gap between the needle 18 and the sample piece Q (see FIG. 29). Moreover, the cutting processing position T2 may be set to a position separated from the side surface by a sum (L+L1) of the predetermined distance L and the predetermined distance L1 of the gap between the needle 18 and the sample piece Q. In this case, the deposition film DM2 (carbon deposition film) remaining on the needle tip end is reduced, and opportunities of cleaning (described later) work of the needle 18 are reduced. Therefore, this case is preferred for continuous automatic sampling.

Figure 30:
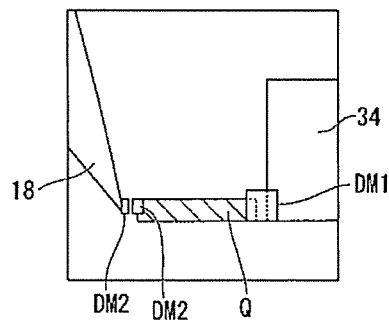
FIG. 30 is a diagram for illustrating a cutting processing position for cutting a deposition film that connects the needle and the sample piece in an image obtained with the focused ion beam in the charged particle beam device according to the embodiment of the present invention.

The computer 22 can separate the needle 18 from the sample piece Q by irradiating the cutting processing position T2 with the focused ion beam for predetermined time. The computer 22 cuts only the deposition film DM2 by irradiating the cutting processing position T2 with the focused ion beam for the predetermined time, to thereby separate the needle 18 from the sample piece Q without cutting the needle 18. In Step S260, it is important to cut only the deposition film DM2. With this configuration, the needle 18 that is once set can be used repeatedly without being replaced for a long time, and hence the automatic sampling can be repeated continuously without operator intervention. This is shown in FIG. 30, which is a diagram for illustrating a state under which the needle 18 is disconnected from the sample piece Q in image data obtained with the focused ion beam in the charged particle beam device 10 according to the embodiment of the present invention. A residue of the deposition film DM2 is deposited on the needle tip end.

The computer 22 determines whether the needle 18 is disconnected from the sample piece Q by detecting conduction between the sample piece holder P and the needle 18 (Step S265). Even after the cutting processing is ended, that is, even after the focused ion beam is applied for the predetermined time in order to cut the deposition film DM2 between the needle 18 and the sample piece Q at the cutting processing position T2, when conduction between the sample piece holder P and the needle 18 is detected, the computer 22 determines that the needle 18 is not disconnected from the sample table 33. When determining that the needle 18 is not disconnected from the sample piece holder P, the computer 22 provides notification to the operator that the separation between the needle 18 and the sample piece Q is not complete through display on the display device 21 or an alarm sound. Then, execution of the subsequent processing is stopped. In contrast, when the conduction between the sample piece holder P and the needle 18 is not detected, the computer 22 determines that the needle 18 is disconnected from the sample piece Q, and continues execution of the subsequent processing.

Figure 31:
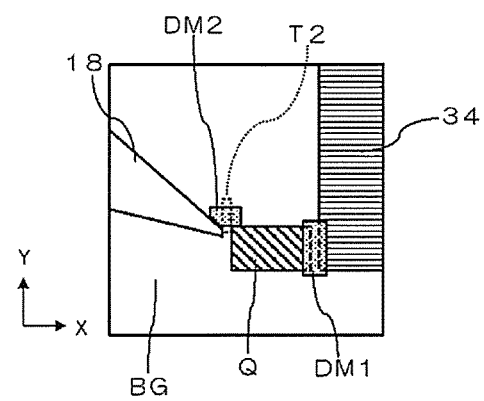
FIG. 31 is a diagram for illustrating a state under which, in a mounting step with a sample piece posture being rotated by 180°, attachment of the sample piece to the sample piece holder is complete, and a range in which irradiation with the focused ion beam is performed in order to separate the needle and the sample piece from each other is defined in the charged particle beam device according to the embodiment of the present invention.
Figure 32:
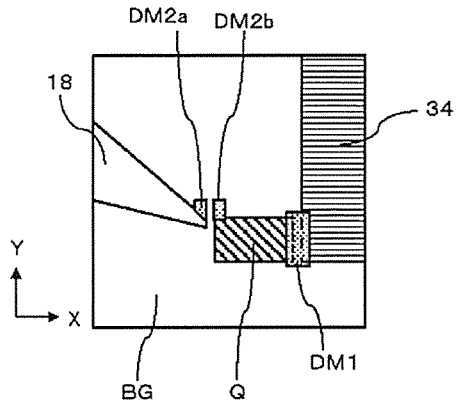
FIG. 32 is a diagram for illustrating a state under which, in the mounting step with the sample piece posture being rotated by 180°, the deposition film has been irradiated with the focused ion beam, and the separation between the needle and the sample piece is complete in the charged particle beam device according to the embodiment of the present invention.
Figure 33:
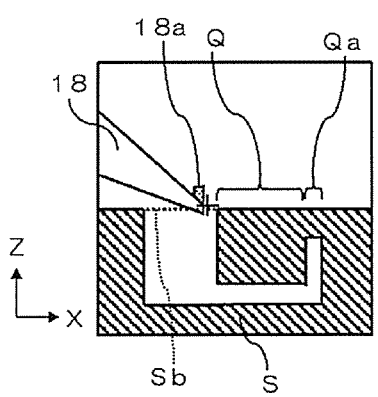
FIG. 33 is a diagram for illustrating, in a pickup step in which the sample piece posture is rotated by 180°, a positional relationship of the needle having the deposition film deposited thereon with the sample piece and a sample surface in the charged particle beam device according to the embodiment of the present invention.

After determining that the separation between the sample piece Q and the needle 18, which have been controlled in posture, is complete in the posture control mode in which the needle 18 is rotated by a predetermined angle, the computer 22 acquires the edges (contour) of the needle 18 in a rotation state and position coordinates of the residue of the deposition film DM2 from the image data acquired by the irradiation with the focused ion beam (Step S270). For example, FIG. 31 is a schematic diagram for illustrating a state under which a sample piece posture is rotated by 180°, and illustrating the cutting processing position T2 for cutting the deposition film DM2 that connects the needle 18 and the sample piece Q in image data obtained with the focused ion beam in the charged particle beam device 10 according to the embodiment of the present invention. Further, FIG. 32 is a schematic diagram for illustrating a state after the cutting processing with the focused ion beam has been performed at the cutting processing position T2 of FIG. 31 to complete the separation between the sample piece Q and the needle 18. A state under which a residue DM2*a* of the deposition film DM2 is deposited on the needle 18 of FIG. 32, and under which the processing has proceeded to the sample piece pickup step in the next sequence of automatic sampling is illustrated in FIG. 33. For example, in FIG. 32, when the needle 18 approaches the sample piece Q, and when the height is aligned between an end surface upper edge 18a of the needle 18 and a sample surface Sb, a step corresponding to a height of the residue DM2a in the Z direction is generated to increase time required for formation processing of the deposition film DM2 after approaching, and reduce bonding strength. Therefore, it is desired for the needle 18 to approach the sample piece Q every time under a state in which there is no residue DM2a on a tip end portion of the needle 18.

Figure 34:
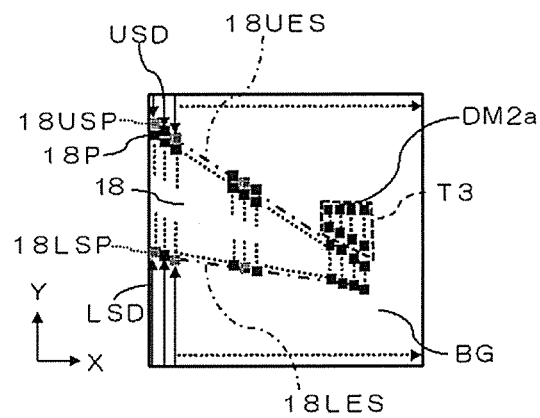
FIG. 34 is a schematic diagram for illustrating, in a mounting step with a needle rotation angle of 180°, a process of extracting needle contour information from an image obtained by irradiation with the focused ion beam to capture a position of the deposition film in the charged particle beam device according to the embodiment of the present invention.
Figure 35:
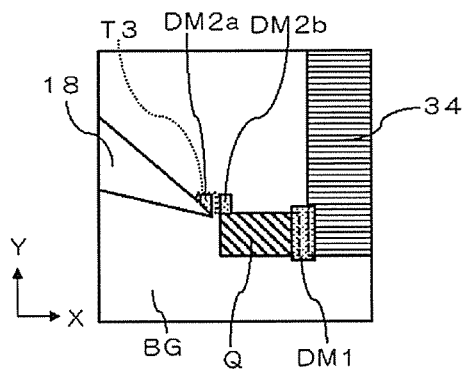
FIG. 35 is a schematic diagram for illustrating, in the mounting step with the needle rotation angle of 180°, a state under which a range in which the deposited deposition film is selectively irradiated with the focused ion beam is defined from the image obtained by the irradiation with the focused ion beam in the charged particle beam device according to the embodiment of the present invention.

An example for removing the residue DM2a is described. For example, FIG. 34 is a schematic diagram for illustrating a process of searching, after the separation from the sample piece Q by the cutting processing of the deposition film DM2, for pixels 18P that exist at boundary positions between the background BG and the needle 18 and have a predetermined difference in brightness with respect to the background BG in a search direction USD for an upper surface in the field of view, and in a search direction LSD for a lower surface in the field of view to extract the edges of the needle 18 by the computer 22 from image data acquired by the irradiation with the charged particle beam. Further, the computer 22 selects a plurality of representative pixels 18USP from the pixels 18P, and determines an upper edge point sequence 18UES of the needle 18 based on position coordinates of the representative pixels 18USP through approximation, for example, a least-squares method. When the representative pixels 18USP are selected from the tip end portion, reliability of the upper edge point sequence 18UES, which is an approximation result, is reduced by the effect of the residue DM2a. Therefore, the representative pixels 18USP are selected from predetermined points avoiding the tip end portion, such as the attachment portion side and an intermediate portion excluding the region of the tip end portion in which the residue DM2a may be deposited. Next, the computer 22 recognizes a group of pixels that are located on the upper side in the image with respect to the upper edge point sequence 18UES of the needle 18, and have a predetermined difference in brightness with respect to the background BG, as the residue DM2a of the deposition film DM2 deposited on the needle 18. FIG. 35 is a schematic diagram for illustrating a state under which a trimming processing region T3 for removing the residue DM2a is determined based on positional information of the recognized residue DM2a.

Moreover, in order to capture the edges of the needle 18 and the position of the residue DM2a, such processing as superimposing the template image acquired in advance by the irradiation with the charged particle beam to extract differences may be used.

Figure 36:
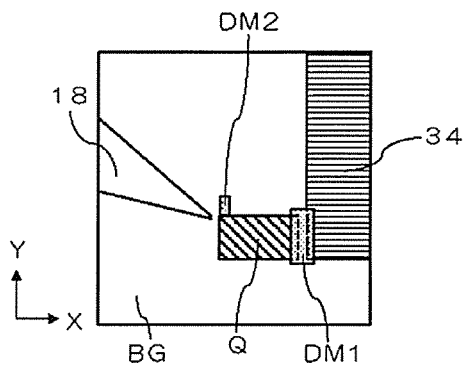
FIG. 36 is a diagram for illustrating a state under which, in the mounting step with the needle rotation angle of 180°, the deposition film has been selectively irradiated with the focused ion beam to remove only the deposition film in the charged particle beam device according to the embodiment of the present invention.

By vector-scanning the focused ion beam over pixels in a processing area T3 of FIG. 35, the computer 22 executes trimming processing on the residue DM2a deposited on the needle 18 (Step S280). A schematic diagram for illustrating a state under which the removal of the residue DM2a is complete is FIG. 36, and it is desired that the processing proceed to the next sequence of automatic sampling every time under such state. Moreover, the computer 22 may store a brightness in pixels of the residue of the deposition film DM2 or the needle 18 before the irradiation with the charged particle beam and a brightness in the background BG to monitor a change in brightness that is caused by sputtering by the irradiation with the focused ion beam whenever required and adjust a dose amount, and may stop the irradiation with the focused ion beam at a timing when the brightness in the pixels becomes equivalent to the brightness in the background, for example. The trimming processing is performed under the state in which the needle 18 is rotated in the sample piece mounting step of the automatic sampling. Therefore, it is not required to separately move the stage to a position for performing the needle cleaning processing, scan, or recognize the needle tip position, and hence required time can be reduced.

Next, a description is given of a first modification example of the embodiment described above.

Figure 37:
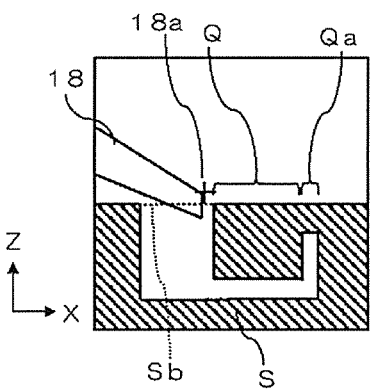
FIG. 37 is a diagram for illustrating, in the pickup step in which the sample piece posture is rotated by 180°, a positional relationship of the needle in a state in which a thickness of a tip end surface is increased with the sample piece and the sample surface in the charged particle beam device according to the embodiment of the present invention.

In FIG. 37, there is illustrated an example of a positional relationship at the time of aligning, when a thickness of a tip end surface of the needle 18 is increased, the height positions of the end surface upper edge 18a of the needle 18 and the sample surface Sb by controlling the needle 18. In order to avoid unintended contact between the lower surface side of the needle 18 and the sample S, it is desired that the needle 18 be subjected to sharpening processing from the upper surface side. In the embodiment described above, the procedure of removing the residue DM2a on the needle 18 by the trimming processing has been described, but in the first modification example, a description is given of sharpening processing of the needle 18 with the use of edge recognition of the needle 18.

Figure 38:
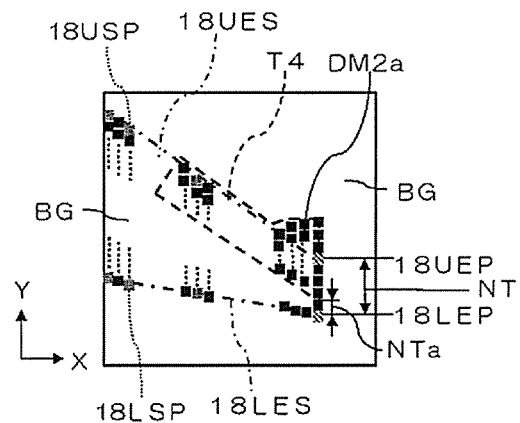
FIG. 38 is a schematic diagram for illustrating, in the mounting step with the needle rotation angle of 180°, a process in which, when a thickness dimension of the needle tip end exceeds a predetermined value, the needle contour information is extracted from the image obtained by the irradiation with the focused ion beam, and a processing area to be trimmed of the deposition film and the needle is defined in the charged particle beam device according to the embodiment of the present invention.
Figure 39:
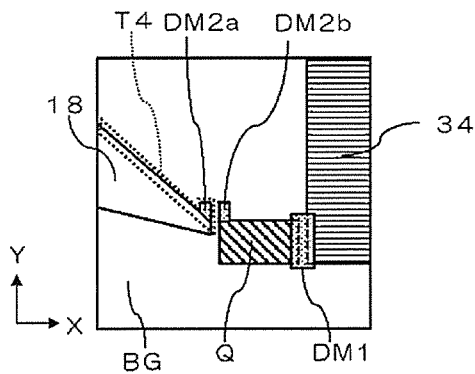
FIG. 39 is a diagram for illustrating, in the mounting step with the needle rotation angle of 180°, a state under which, when the thickness dimension of the needle tip end exceeds the predetermined value, a range in which the irradiation with the focused ion beam is performed is defined only on an upper surface of the needle tip end including the deposition film deposited on the needle tip end in the charged particle beam device according to the embodiment of the present invention.

In defining the processing area with the focused ion beam for performing shaping processing on each set of position coordinates of the pixels extracted as the residue DM2a of the deposition film DM2 or the needle 18, the computer 22 branches to processes with different processing areas based on determination to be described below. The computer 22 measures a distance between a tip-end side end point pixel 18UEP of the upper edge point sequence 18UES and a tip-end side endpoint pixel 18LEP of a lower edge point sequence 18LES within the image data plane of the needle 18 as a thickness NT of the tip end of the needle 18. When the thickness NT is a set predetermined initial value NTa (for example, 1 µm) or less, the focused ion beam is vector-scanned while limiting to the pixel group of the residue DM2a as described above. Moreover, when the thickness NT exceeds the initial value NTa, a processing range is changed. Next, a description is given of the embodiment in which the processing range is changed. In FIG. 38, a process at the time of the edge recognition of the needle 18 during the processing in such step is illustrated. The process of searching for the pixels 18P having the difference in brightness is the same as in FIG. 34. The computer 22 defines the processing area on the basis of the result of determination of the thickness NT such that, as the processing result, the thickness NT of the needle 18 falls within the set predetermined initial value NTa. The computer 22 sets a processing area T4 that is surrounded by a point sequence obtained by translating the upper edge point sequence 18UES within the image plane of the extracted needle 18 by a distance obtained by subtracting a predetermined thickness from the thickness NT in a −Y direction in the image and the upper edge point sequence 18UES of the needle 18, and that contains a region up to a specified length (for example, 100 µm) in the X direction and the region extracted as the residue DM2a. The focused ion beam is vector-scanned over pixels located within the processing area T4 to perform the sharpening processing. FIG. 39 is a schematic diagram for illustrating a positional relationship between the above-mentioned processing area T4 and the needle 18.

Next, a description is given of a second modification example of the embodiment described above. In the above description, there has been described a procedure in which the trimming processing of the residue DM2a on the needle 18 and the sharpening processing of the needle 18 are performed after the separation of the sample piece and the needle (Step S260) by the charged particle beam device 10 of the present invention, but in the second modification example, a description is given of an embodiment in which the trimming processing of the residue DM2a on the needle 18 and the sharpening processing of the needle 18 at the same time with the separation.

Figure 40:
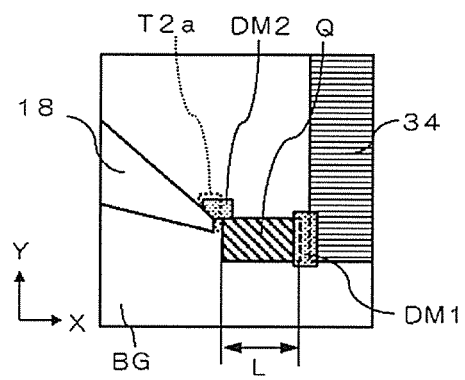
FIG. 40 is a diagram for illustrating, in the mounting step with the needle rotation angle of 180°, a processing range for separating the needle and the sample piece from each other is enlarged to the deposition film deposited on the needle in the charged particle beam device according to the embodiment of the present invention.
Figure 41:
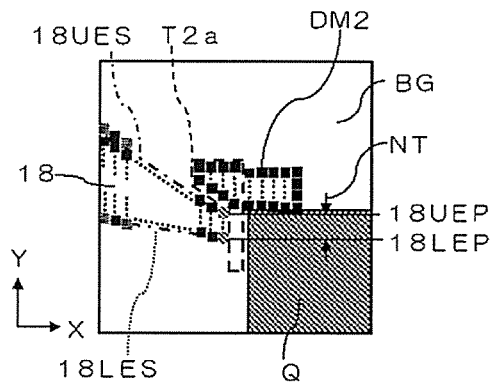
FIG. 41 is a diagram for illustrating, in the mounting step with needle rotation angle of 180°, a process in which the processing range for removing the deposition film deposited on the needle at the same time with the separation between the needle and the sample piece is defined in the charged particle beam device according to the embodiment of the present invention.

The computer 22 may irradiate the residue of the deposition film DM2 or the needle 18 with the focused ion beam at the timing of separation between the needle 18 and the sample piece Q. Through performing the separation and the trimming processing at the same timing, it is possible to reduce the scan time required to acquire the image data. For example, FIG. 40 is a schematic diagram of image data acquired by irradiating the needle 18 and the sample piece Q with the focused ion beam by the charged particle beam device 10 before the needle 18 and the sample piece Q are separated from each other. Further, FIG. 41 is a schematic diagram of a process of extracting the edge point sequences near the connection portion between the needle 18 and the sample piece Q under the state of FIG. 40. The computer 22 determines, after extracting the upper edge point sequence 18UES and the lower edge point sequence 18LES of the needle 18 on the basis of the same procedure as described above, position coordinates of side surface edges on the basis of the information of the length L in the X direction of the sample piece Q that is set in advance, and defines a processing area T2a by extending to the side surface edge on the needle 18 side of the sample piece Q (FIG. 41). Further, through application of the above-mentioned branching after the needle tip shape is recognized, the processing area T2a obtained by including the processing area T2 in the processing area T3 and the processing area T4 may be defined. Moreover, after the edges of the needle 18 are extracted, searching may be performed in the horizontal direction within the image plane to extract a side surface edge point sequence of the sample piece Q, to thereby define the range of the processing area T2a. Over the processing area T2a after the extension, the focused ion beam is vector-scanned as in the embodiment described above to execute processing.

Figure 42:
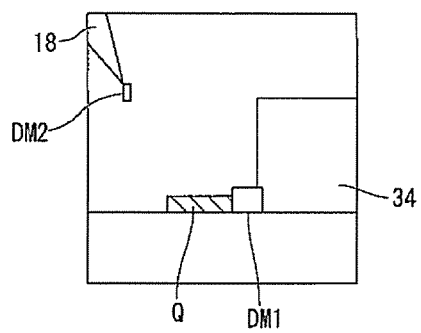
FIG. 42 is a diagram for illustrating a state under which the needle is retracted in image data obtained with the focused ion beam in the charged particle beam device according to the embodiment of the present invention.
Figure 43:
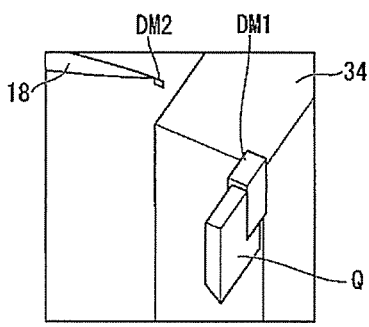
FIG. 43 is a diagram for illustrating the state under which the needle is retracted in an image obtained with the electron beam in the charged particle beam device according to the embodiment of the present invention.

Next, the computer 22 performs needle retraction processing (Step S290). The computer 22 moves the needle 18 away from the sample piece Q by the predetermined distance by the needle driving mechanism 19. The computer 22 raises the needle 18 upward in the vertical direction, that is, in the positive direction of the Z direction by 2 mm or 3 mm, for example. This is shown in FIG. 42 and FIG. 43, which are a schematic diagram (FIG. 42) of the state under which the needle 18 is retracted upward from the sample piece Q in an image obtained with the focused ion beam in the charged particle beam device 10 according to the embodiment of the present invention, and a schematic diagram (FIG. 43) of the state in an image obtained with the electron beam.

Next, it is determined whether sampling is to be performed continuously from a different position in the same sample S (Step S300). The setting of the number to be sampled is registered in advance in Step S010, and hence the computer 22 refers to the data to determine the next step. When the sampling is to be performed continuously, the processing returns to Step S030, and the subsequent processing is continued as described above to execute the sampling work. When the sampling is not to be performed continuously, the sequence of flow is ended.

The generation of the template of the needle in Step S050 may be performed immediately after Step S280. As a result, in steps in preparation for the next sequence of sampling, it is not required to perform Step S050 in the next sequence of sampling, and the steps can be simplified.

As described above, the sequence of automatic sampling operation is ended.

The above-mentioned flow from the start to the end is merely an example, and steps may be interchanged or skipped as long as the overall flow is not interfered with.

Through the above-mentioned continuous operation from the start to the end, the computer 22 can execute sampling operation without operator intervention. With the above-mentioned method, the sample may be sampled repeatedly without replacing the needle 18, and hence a large number of sample pieces Q can be sampled continuously with the use of the same needle 18.

As a result, the charged particle beam device 10 can automatically prepare a large number of sample pieces Q from one sample S without shaping the same needle 18 in separating and isolating the sample piece Q from the sample S, and further without replacing the needle 18 itself in repeated use. The sampling can be executed without performing manual operation by the operator as in the related art.

In the embodiments described above, the computer 22 also includes software functional units or hardware functional units, such as an LSI.

Moreover, in the embodiments described above, a sharpened needle-like member is described as an example of the needle 18, but the tip end may have a shape, for example, a flat chisel shape.

Moreover, the present invention is applicable also to a case in which at least the sample piece Q to be isolated is made of carbon. The sample piece Q can be moved to a desired position with the use of the template and the tip end position coordinates in the present invention. In other words, when the isolated sample piece Q is to be transferred to the sample piece holder P while being fixed to the tip end of the needle 18, the sample piece Q can be controlled to approach the sample piece holder P with a predetermined gap and stop, with the use of the real tip end coordinates (tip end coordinates of the sample piece) acquired from secondary electron images obtained by irradiating the needle 18 having the sample piece Q attached thereto with the charged particle beam, and the template of the needle 18 formed based on the absorption current image of the needle 18 having the sample piece Q attached thereto.

Moreover, the present invention is applicable also to another device. For example, in a charged particle beam device configured to measure electrical characteristics of a minute portion by bringing a probe into contact therewith, in particular, in a charged particle beam device in which a metal probe is included in a sample chamber of a scanning electron microscope with the electron beam of the charged particle beams, and in which a tungsten probe having carbon nanotubes at the tip end thereof is used for measurement for bringing the probe into contact with a conductive portion of a fine region, the tip of the tungsten probe cannot be recognized due to the background, for example, a wiring pattern in a normal secondary electron image. The recognition of the tungsten probe can be facilitated by the absorption current image, but the tip end of the carbon nanotubes cannot be recognized, with the result that the carbon nanotubes cannot be brought into contact with the measurement point, which is important. To address this problem, through use of the method of identifying the real tip end coordinates of the needle 18 with the secondary electron images and generating the template with the absorption current image in the present invention, the probe with the carbon nanotubes can be moved to, and brought into contact with, the particular measurement position.

The sample piece Q prepared by the charged particle beam device 10 according to the present invention described above may be introduced into another focused ion beam device, and the device operator may carefully operate and process the sample piece Q to a thickness that is thin enough for analysis with a transmission electron microscope. The charged particle beam device 10 according to the present invention may be used together with a focused ion beam device as described above such that a large number of sample pieces Q are fixed to the sample piece holder P without operator invention during the night, and the device operator can carefully process the sample piece Q into an ultra-thin sample for the transmission electron microscope during the day. Therefore, as compared to the related art, in which the series of work from isolation of the sample to processing the sample into a thin piece relies on the operation of the device operator on one device, mental and physical burden on the device operator is significantly reduced, and work efficiency is thus increased.

The embodiments described above are presented as examples, and are not intended to limit the scope of the invention. Those novel embodiments may be implemented in other various modes, and various kinds of omissions, replacements, and modifications can be made thereto without departing from the gist of the invention. Those embodiments and modifications thereof are included in the scope and gist of the invention, and are included in the scopes of the invention described in the appended claims and their equivalents.

For example, in the charged particle beam device 10 according to the present invention, the needle 18 has been described as means for isolating the sample piece Q. However, the present invention is not limited thereto, and tweezers that operate finely may be used instead. With the use of the tweezers, the sample piece Q can be isolated without the deposition, and there is no worry for wearing of the tip end, for example. Even when the needle 18 is used, the connection with the sample piece Q is not limited to the deposition. For example, the needle 18 may be brought into contact with the sample piece Q while the needle 18 is applied with electrostatic force, and the connection between the sample piece Q and the needle 18 may be established through electrostatic adsorption.

What is claimed is:

1. A charged particle beam device, which is configured to automatically perform steps of isolating a sample piece from a sample, shifting a posture of the sample piece, and fixing the sample piece to a sample piece holder, the charged particle beam device comprising:
    a charged particle beam irradiation optical system configured to apply a charged particle beam;
    a sample stage, on which the sample is to be placed, and which is configured to move;
    a needle including a movement mechanism, the movement mechanism including a rotation axis and being configured to hold and carry the sample piece;
    a holder fixing table configured to hold the sample piece holder, to which the sample piece is to be transferred;
    a gas supply portion configured to supply a gas, from which a deposition film is to be formed through application of a focused ion beam; and
    a computer configured to perform control so that, without rotating the needle with which the sample piece is fixed to the sample piece holder, the deposition film deposited on the needle is irradiated with the charged particle beam from the charged particle beam irradiation optical system after disconnecting the needle from the sample piece and under the state in which the needle is rotated for mounting the sample piece to the sample holder such that the deposition film which remains on the needle is removed after disconnecting the needle from the sample piece.

2. The charged particle beam device according to claim 1, wherein the computer is configured to irradiate the deposition film and the needle with the charged particle beam from the charged particle beam irradiation optical system.

3. The charged particle beam device according to claim 2, wherein the computer is configured to perform processing of removing an end surface of the needle by irradiating the end surface with the charged particle beam from the charged particle beam irradiation optical system, the end surface being formed when the sample piece and the needle are separated from each other.

4. The charged particle beam device according to claim 2, wherein the computer is configured to irradiate a side of the needle on which the deposition film is deposited, with the charged particle beam from the charged particle beam irradiation optical system.

5. The charged particle beam device according to claim 2, wherein the computer is configured to irradiate, when a thickness dimension of a tip end of the needle exceeds a predetermined value, a side of the needle on which the deposition film is deposited, with the charged particle beam from the charged particle beam irradiation optical system, to perform processing so that the thickness dimension falls below the predetermined value.

6. The charged particle beam device according to claim 1, wherein the computer is configured to end application of the charged particle beam from the charged particle beam irradiation optical system depending on a change in brightness of each pixel in image data of the deposition film and the needle, the image data being acquired by irradiating the deposition film and the needle with the charged particle beam.

* * * * *